(12) United States Patent
Nakamura et al.

(10) Patent No.: US 8,039,927 B2
(45) Date of Patent: Oct. 18, 2011

(54) LINEAR SEMICONDUCTOR SUBSTRATE, AND DEVICE, DEVICE ARRAY AND MODULE, USING THE SAME

(75) Inventors: Toshihiro Nakamura, Tokyo (JP); Nobuaki Orita, Tokyo (JP); Hisashi Koaizawa, Tokyo (JP); Kenkichi Suzuki, Tsukuba (JP); Hiroshi Kuraseko, Tokyo (JP); Michio Kondo, Tsukuba (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 623 days.

(21) Appl. No.: 11/386,871

(22) Filed: Mar. 23, 2006

(65) Prior Publication Data
US 2006/0263921 A1    Nov. 23, 2006

Related U.S. Application Data

(63) Continuation of application No. PCT/JP2004/013961, filed on Sep. 24, 2004.

(60) Provisional application No. 60/505,405, filed on Sep. 23, 2003.

(51) Int. Cl.
*H01L 29/06*        (2006.01)
(52) U.S. Cl. ................ 257/618; 257/E27.125
(58) Field of Classification Search ............ 257/618, 257/E27.124, E27.125
See application file for complete search history.

(56) References Cited

U.S. PATENT DOCUMENTS

| 5,838,868 | A | * | 11/1998 | Krol et al. | 385/127 |
| 2003/0173892 | A1 | * | 9/2003 | Terashita | 313/500 |
| 2006/0257074 | A1 | * | 11/2006 | Suzuki et al. | 385/49 |
| 2007/0252136 | A1 | * | 11/2007 | Lieber et al. | 257/24 |

FOREIGN PATENT DOCUMENTS

| JP | 57-26476 | 2/1982 |
| JP | 61-035547 | 2/1986 |
| JP | 63-232467 | 9/1988 |
| JP | 03-271140 | 12/1991 |
| JP | 6-252429 | 9/1994 |
| JP | 2003-174171 | 6/2003 |

OTHER PUBLICATIONS

U.S. Appl. No. 12/267,917, filed Nov. 10, 2008, Kuraseko, et al.

* cited by examiner

*Primary Examiner* — Matthew E Warren

(74) *Attorney, Agent, or Firm* — Oblon, Spivak, McClelland, Maier & Neustadt, L.L.P.

(57) ABSTRACT

The linear semiconductor substrate 1 or 2 of the present invention comprises at least one desired thin film 4 formed on a linear substrate 3 having a length ten or more times greater than a width, thickness, or diameter of the linear substrate itself. Adopting semiconductor as the thin film 4 forms a linear semiconductor thin film. The linear semiconductor substrate 1 or 2 of the present invention is produced by utilizing a fiber-drawing technique which is a fabricating technique of optical fibers.

15 Claims, 20 Drawing Sheets

LINEAR SEMICONDUCTOR SUBSTRATE, AND DEVICE, DEVICE ARRAY AND MODULE, USING THE SAME

CROSS-REFERENCE

This application is a continuation application of PCT/JP04/013961, filed Sep. 24, 2004, which claims priority to U.S. Provisional Application Ser. No. 60/505,405, filed Sep. 23, 2003, the entire contents of each are incorporated herein by reference.

TECHNICAL FIELD

The present invention relates to a linear or one-dimensional semiconductor substrate as a semiconductor circuit substrate and a fabricating method thereof, and a device, a device array, a module, a display, a solar cell, a solar cell module using the linear semiconductor substrate, and a fabricating method thereof.

BACKGROUND ART

Generally, substrates to be typically used, such as semiconductor substrates exemplarily made of silicon, gallium arsenide (GaAs), gallium nitride (GaN) and the like, and a glass substrate for display, are two-dimensional planar substrates, respectively.

The semiconductor substrates such as made of silicon, GaAs, and the like are each provided and used in a manner to pull up a molten raw material by using a seed crystal to thereby fabricate an ingot of single crystal, and to cut it into semiconductor substrates, followed by application of grinding and polishing to provide them with mirror surfaces, respectively.

In case of a liquid-crystal oriented TFT (thin film transistor) comprising semiconductor thin films formed on a two-dimensional glass substrate, a polycrystalline silicon (hereinafter abbreviated to "p-Si") or an amorphous silicon (hereinafter abbreviated to "a-Si") is deposited on a multi-component two-dimensional (planar) glass substrate by a vacuum process such as a plasma CVD (hereinafter abbreviated to "PCVD"). In case of p-Si, it is achieved to grow a crystal grain into a larger grain diameter, so as to improve a performance of a TFT. In this case, the p-Si is locally heated by laser, in a manner to melt and solidify the p-Si by moving the laser, thereby growing the crystal in a direction of a horizontal plane of a substrate (this is called "lateral crystal growth"). This forms a p-Si recrystallizedly grown in a line along which the laser was moved. It is required to repeat this procedure until achievement of a predetermined width.

Note that upsized two-dimensional substrates have been developed up to now, so as to decrease a fabricating cost of two-dimensional substrates. Upsized substrates are developed to have a size of 730×920 mm in the fourth generation in the year 2002, and a size of 1,100×1,300 mm in the fifth generation in 2003, and it is thus predicted that the sixth generation in 2004 to 2005 will have a size of 1,500×1,800 mm.

Substrates to be each used for a liquid crystal display or a solar cell are provided and used by grinding and polishing a plate glass such as prepared by a float process, and by cutting it into a predetermined size. Depending on the usage, such glass is possibly used by cutting only, without grinding and polishing.

Meanwhile, concerning a display, there has been filed by SARNOFF CORPORATION located in the United States a Japanese patent application 2000-601699 (P2000-601699) disclosing an invention configured to integrate light emitting devices into a fiber which is rectangle, circular or the like in cross section, and to integrated fibers are brought them into an array to establish a planar display.

In case of adopting a conventional two-dimensional substrate, upsizing a display increases the number of pixels proportionally to the square of a screen size. As a result, upsizing a screen considerably deteriorates a yield, when a defect occurrence ratio is unchanged. This naturally leads to an increased fabricating cost per one display, thereby problematically and considerably increasing a fabricating cost in inverse proportion to the yield. This is because, when even one portion of a screen has a defective device, it is impossible to replace only the portion or an area around it so as to repair the screen.

According to the invention by the SARNOFF CORPORATION, it is possible to replace only a fiber including a defective device integrated therewith to thereby repair the screen, thereby providing an advantage of a remarkably improved yield. Also disclosed in this patent-related reference, is a fabricating method of a fiber including devices integrated therewith.

According to the method adopting a fiber substrate (linear substrate) disclosed in the patent-related reference, it becomes possible to downsize a producing apparatus of a display as compared with a conventional method for adopting a two-dimensional substrate. Further, the disclosed method is advantageous in equipment investment and production yield, since a size of each surface to be worked can be downsized by achieving a width of a linear substrate which is commensurate with a width of each device, thereby allowing a fine working with a higher precision.

In the method of the patent-related reference, since it is required to fabricate a large number of linear substrates, various processes related to the production of linear substrates are to be excellent in productivity. In this patent-related reference, it is explained in the patent-related reference that a columnar magnetron plasma source is used to enable CVD and sputtering deposition at higher rates, respectively. Further, it is to be achieved to provide a plurality of chambers between a fiber supply reel and a winding reel, thereby continuously or intermittently conducting treatments for cleaning, and for depositing a transparent electrode (ITO, $SnO_2$, ZnO, or the like), electric conductor (Cu, Al, or the like), OLED (organic EL), electrodes (Mg/Ag, Ca/Al, or the like), and protective film (oxide film, nitride film, or the like).

Since the transparent electrode (ITO, $SnO_2$, ZnO, or the like) and electric conductor (Cu, Al, or the like) are continuously deposited on each linear substrate in the longitudinal direction thereof, it becomes possible to adopt a pre-worked linear substrate which results in a treatment process excluding the corresponding procedures. As a fabricating method of the pre-worked fiber, it is disclosed to obtain the same by coating an ITO layer, electric conductor, or another desired layer onto a quartz fiber just after drawing it.

There will be now explained a related art of a solar cell. Solar cells are each capable of directly converting a substantially exhaustless solar energy into an electrical energy, thereby serving as a clean energy. Based thereon, solar cells each acts as one of the energies, which never cause environmental problems, and to which an attention is directed as an alternative of thermal power generation using a fossil fuel. Only, due to an increased fabricating cost of solar cells, it is a present state in Japan that an electricity rate based on power generation by solar cells is about 70 yen/kWh (2003) which is about three times as expensive as an electricity rate of 25 yen/kWh of the mains-power.

Presently, there are mainly utilized solar cells each adopting a single crystal silicon substrate or polycrystalline silicon substrate which is excellent in conversion efficiency. In this case, it is typical to adopt a P type substrate, and to dope phosphorus (P) into a surface of the substrate to thereby bring the surface into an N type semiconductor, thereby forming a PN junction in a thickness direction of the substrate. Further, the substrate is formed with electrodes at an obverse surface and a reverse surface of the substrate, respectively, and the surfaces of the substrate is coated by a protective film(s) of silicon dioxide ($SiO_2$) or silicon nitride ($Si_3N_4$), thereby establishing a solar cell. Further, there is provided a solar cell module by integrating a plurality of the solar cells into a panel, and there is further provided a solar cell array by integrating a plurality of the modules. This solar cell array is combined with a discharge/charge controller, battery, inverter, or the like, thereby establishing a solar cell system.

Meanwhile, there has been disclosed a technique concerning a solar cell without using silicon substrates. This is to use a multicomponent glass substrate (blue plate glass or white plate glass) as a substrate. The glass substrate is formed thereon with a film of $SiO_2$ at a relatively low temperature of about 300° C. by sputtering, vapor deposition, CVD or the like, and there is further formed thereon a transparent electroconductive film of ITO ($InSnO_2$), $SnO_2$, ZnO, or the like by sputtering. Further deposited on the transparent electroconductive film is amorphous silicon (hereinafter abbreviated to "a-Si") by a PCVD method. Devices are each provided in a structure of PIN diode comprising three layers of P type, I type, and N type, for example. Further deposited on the a-Si is a reverse surface electrode by vapor deposition, sputtering, or the like. Since the a-Si can be deposited at a low temperature, it is possible to form it into a transparent film. In the solar cell as described above, there is used a substrate having a size of 1 $m^2$ and a thickness of 4 mm. As a result, its weight becomes as heavy as about 9 kg.

In addition to the above description, there have been also investigated binary compound semiconductors such as GaAs, InP, CdS, CdTe or the like, or ternary compound semiconductors such as $CuInSe_2$. Further, there has been also developed a pigment-impregnated solar cell comprising a porous $TiO_2$ impregnated with pigment. There has been further developed a solar cell utilizing organic semiconductor. Also in these solar cells, semiconductor substrates or glass substrates are used.

Further, described in U.S. Pat. No. 5,437,736 (Semiconductor Fiber Solar Cells and Modules) is an invention configured to provide solar cells each obtained by coating an electroconductive layer such as molybdenum (Mo) onto a curved face of an optical fiber and by partially forming first and second semiconductor layers in arched shapes on the optical fiber, so as to array the solar cells in a planar shape to thereby form a solar cell module. In the described invention, it is shown to deposit Mo by a fiber-drawing process in FIGS. 14, 17 of the U.S. Patent. Deposited on the fiber wound on a spool are two semiconductor films in a separate process, followed by deposition of a transparent electrode, thereby establishing a solar cell.

Patent-related reference 1: Japanese Patent Application No. 2000-601699
Patent-related reference 2: U.S. Pat. No. 5,437,736

DISCLOSURE OF INVENTION

Problem to be Solved by the Invention

While silicon single crystal substrates are each about 0.3 mm in thickness in case of φ4" and about 0.8 mm in case of φ12", those portions functioning as devices are on the order of several hundreds nm to 1 μm in depth from a surface of a substrate in case of a MOSFET (metal oxide semiconductor field effect transistor) mainly used in LSI and VLSI, for example. Further, thermally-oxidized films for gates are each 100 nm or less in thickness. Thus, in case of silicon single crystal substrates, those portions having functions as devices are each about 0.1 to 0.3% in depth from the surface of the substrate, so that most of the substrate merely functions as a simple structural body.

In a fabricating process of an Si substrate, grown from a silicon melt heated to a temperature above its melting point, is a crystal to a tip end of a seed crystal, and the crystal is grown by pulling up, thereby fabricating an ingot. Thereafter, the ingot is ground into a cylindrical shape, and cut into substrates, which are each ground and polished at its surface, thereby fabricating wafers, respectively. During these processes, there is removed about ½ to ⅓ of the weight of the pulled up ingot. Thereafter, 20% to 30% of the resultant weight is further removed, in a process for bringing each wafer formed with devices into chips. Thus, the effectively utilized ratio of silicon is about 50% at a stage of the final chip process as compared with the initial stage, so that high purity silicon can not be regarded as being effectively utilized.

Meanwhile, in case of a liquid-crystal oriented TFT comprising semiconductor thin films formed on a two-dimensional glass substrate, it is achieved to grow a p-Si crystal grain by laser. However, two-dimensional substrates to be used are each typically made of multicomponent glass having a melting point (about 600° C.) which is lower than that of Si because only two-dimensional substrates made of inexpensive materials are usable from a standpoint of cost, resulting in that each substrate is allowed to be heated only locally. As such, it has been required to form p-Si and a-Si by PCVD or sputtering which is slow in deposition rate, and to grow a crystal grain by laser anneal. In case of achieving recrystallization by laser anneal, it is required to widen laser beam into a sheet shape, thereby problematically requiring usage of YAG or excimer laser which has a larger power and is thus expensive. Further, p-Si including a lot of crystal grains acting as nuclei exists around the portion melted by the laser sheet or beam, thereby problematically and essentially making it difficult to obtain a larger crystal grain boundary.

To attain two-dimensional substrates at a decreased cost, it is now promoted to provide upsized substrates. However, it is required to use a low temperature process due to restriction by substrates, thereby requiring to use an expensive vacuum apparatus, resulting in a considerably increased equipment cost due to the upsizing. Meanwhile, in the conventional fabricating methods of two-dimensional substrates, it is required to improve accuracies of various processes simultaneously with increased substrate sizes in a manner to necessitate large-sized producing apparatuses with higher accuracies, thereby requiring an enormous equipment investment due to the increased substrate sizes.

In the invention of the patent-related reference 1 related to a display, there is adopted a reel-to-reel scheme, thereby causing a problem of a lower productivity even by the used expensive vacuum apparatus. Further, in case of adopting glass fibers, the glass fibers are each provided in a structure to be contacted with a guide roll and a mask, and it is further required to apply a tension to the fiber so as to straightly stretch it. In turn, when a fine crack is caused in a fiber due to contact thereof with a guide roll or the like, the fiber may be broken at the crack. Once the breakage is caused, the associated vacuum apparatus is required to be stopped, thereby not only considerably deteriorating an operation rate but also exposing the fiber to the atmosphere, in a manner to cause adsorption of or reaction with the atmosphere by the fiber, thereby possibly failing to conduct a normal process.

Further, in the invention of the patent-related reference 1, although it is described to continuously produce a transparent electroconductive film such as ITO or the like and an electroconductive film such as metal or the like in the course of the fiber-drawing process for producing the fibers by describing that "a quartz fiber is coated with an ITO layer, an electroconductive layer, or another suitable layer, just after the fiber is stretched during production, for example", the fabricating method therefor is never disclosed. Further, no description is found in terms of semiconductor substrates and the like.

In turn, concerning solar cells, although it is required to decrease a fabricating cost thereof to decrease an electricity rate, this is extremely difficult because the raw material cost (substrate cost) is extremely high in a method adopting silicon substrates. On the other hand, in the method for adopting glass substrates, it is being investigated to decrease a fabricating cost by upsizing a substrate and by improving a throughput. In the present state, although solar cells adopting a-Si are most promising for a decreased cost, deposition of a-Si is to be conducted at a low temperature such that improvement of deposition rate is difficult, thereby problematically failing to attain an increased film thickness. Further, a-Si has an absorption wavelength band of 0.8 μm or shorter which is narrower than that of 1.1 μm or shorter of a polycrystalline silicon, thereby problematically lower a conversion efficiency of a solar cell using a-Si. Moreover, even in case of achievement of an upsized glass substrate for a decreased cost, it is also required to provide large-sized producing apparatuses as described above, thereby problematically and considerably increasing an equipment cost. Furthermore, upsized substrates lead to increased weights, thereby causing a secondary problem of increased transference cost, installation cost, and the like.

In the patent-related reference 2, although there are disclosed optical fibers, and electroconductive films to be coated onto surfaces of the fibers, no disclosure is found about a fabricating method thereof. Further, the process for depositing semiconductors is separate from the fiber-drawing process and the deposition method is a vapor deposition method, thereby causing a problem that the deposition rate is slow to thereby lower the productivity, and crystal grain diameters are also made small to thereby only obtain semiconductor films which are not so excellent in crystallinity.

Means for Solving the Problem

To solve the above problems, the present invention provides the following constitutions as means for solving the problems.

Namely, the present invention provides a first configuration residing in a linear substrate characterized in that the linear substrate comprises a line-shaped backing having a length more than ten times greater than a width, thickness, or diameter of the backing (hereinafter called "linear substrate"), and at least one layer of desired thin film formed on the linear substrate.

The present invention provides a second configuration residing in the linear semiconductor substrate, characterized in that the thin film is a semiconductor thin film.

The present invention provides a third configuration residing in the linear semiconductor substrate, characterized in that there is used a high melting point material made of ceramics such as quartz glass, multicomponent glass, sapphire, alumina, carbon, silicon carbide, and the like as the linear substrate.

The present invention provides a fourth configuration residing in the linear semiconductor substrate, characterized in that the linear semiconductor substrate is in a rectangular or polygonal cross section.

The present invention provides a fifth configuration residing in the linear semiconductor substrate, characterized in that the ratio (=(R/[length of straight portion])×100) between each R at a corner and a length of a straight portion of the cross section is 10% to 50%.

The present invention provides a sixth configuration residing in the linear semiconductor substrate, characterized in that the semiconductor thin film has a surface deposited with $SiO_2$ or $Si_3N_4$.

The present invention provides a seventh configuration residing in the linear semiconductor substrate, characterized in that the $SiO_2$ comprises a thermally-oxidized film or is formed by a thermal CVD method.

The present invention provides an eighth configuration residing in the linear semiconductor substrate, characterized in that the semiconductor thin film has a thickness between 10 nm inclusive and 1 μm inclusive.

The present invention provides a ninth configuration residing in the linear semiconductor substrate, characterized in that the semiconductor thin film has a grain boundary between 10 μm inclusive and 1,000 μm inclusive.

The present invention provides a tenth configuration residing in the linear semiconductor substrate, characterized in that the semiconductor thin film, or an insulating film deposited on the semiconductor thin film, is coated thereon with a resist material, UV curable resin, electron beam cross-linking resin, or the like.

The present invention provides an 11th configuration residing in the linear semiconductor substrate, characterized in that the linear semiconductor substrate is covered by the semiconductor thin film at a side surface (surface in the longitudinal direction) of the former.

The present invention provides a 12th configuration residing in a semiconductor device and a module, the semiconductor device being provided as a chip formed with electronic elements such as diode, IC, LSI, or the like, optical elements such as LD, PD, LED, or the like, solely, plurally, or combinedly, and the module including it/them incorporated thereinto, characterized in that the linear substrate is used as a substrate for fabricating the device.

The present invention provides a 13th configuration residing in a semiconductor steric device (hereinafter called "three-dimensional device") and a module using the three-dimensional device, characterized in that the three-dimensional device includes, as the linear substrate therefor, the linear substrate having a substantially rectangular or substantially polygonal cross section, and the linear substrate has a plurality of surfaces three-dimensionally formed with devices, circuits, and/or wirings, respectively.

The present invention provides a 14th configuration residing in the three-dimensional device and the module using the three-dimensional device, characterized in that one or two of the surfaces of the three-dimensional device is/are used as an electrical contact portion(s).

The present invention provides a 15th configuration residing in the three-dimensional device and the module using the three-dimensional device, characterized in that at least device portions are formed on the same surface.

The present invention provides a 16th configuration residing in the three-dimensional device and the module using the three-dimensional device, characterized in that the linear substrate is formed with a polycrystalline semiconductor film having a grain boundary size of 10 μm to 1,000 μm.

The present invention provides a 17th configuration residing in a semiconductor device array characterized in that the semiconductor devices are formed in the longitudinal direction of the linear substrate at predetermined pitches.

The present invention provides an 18th configuration residing in the semiconductor device and the semiconductor device array, characterized in that the linear semiconductor substrate has a plurality of surfaces formed with the same or different ones of the semiconductor devices or the semiconductor device arrays, respectively.

The present invention provides a 19th configuration residing in a linear electroconductive substrate characterized in that at least one of the semiconductor thin films deposited on the linear semiconductor substrate is an electroconductive film, and that another of the semiconductor thin films is a liquid resin obtained by coating a resin, or a resin obtained by coating and hardening a resin.

The present invention provides a 20th configuration residing in the linear electroconductive substrate, characterized in that the electroconductive film is the semiconductor thin film which is substantially transparent in a visible range, and which comprises indium tin oxide (ITO), tin oxide ($SnO_2$) or zinc oxide (ZnO).

The present invention provides a 21st configuration residing in the linear electroconductive substrate, characterized in that the resin to be coated is: a resist; a UV curable resin; silicone; oils such as fluorine oil, mineral oil, and the like; greases of the oils; and the like.

The present invention provides a 22nd configuration residing in the linear substrate, characterized in that the thin film formed on the fiber comprises at least one kind of metal or oxide film, or combination thereof.

The present invention provides a 23rd configuration residing in the linear substrate, characterized in that the metal or oxide film has a specific resistance at least included in a range of $10^{-4}$ Ωcm to $10^{-8}$ Ωcm.

The present invention provides a 24th configuration residing in the linear substrate, characterized in that the linear substrate includes a linear substrate provided by drawing out a metal through a die or by rolling the metal into a linear material.

The present invention provides a 25th configuration residing in the linear substrate, characterized in that the linear substrate is formed with one or more layers of oxide films or metal films.

The present invention provides a 26th configuration residing in, in a fiber-drawing method comprising the steps of:

melting a glass parent material worked into a desired shape within a heating furnace and spinning the material, or melting a glass raw material within a heated crucible and spinning the material, to thereby produce a fiber;

withdrawing the spun and produced fiber by a withdrawer while controlling a withdrawing speed of the fiber, or a feeding speed of the parent material, or both, so that the spun and produced fiber has a constant outer diameter; and winding up the fiber by a winder;

a linear substrate fabricating method for producing the linear substrate, characterized in that the linear substrate fabricating method comprises the step of:

forming the or each thin film on the fiber during fiber-drawing, thereby producing the linear substrate.

The present invention provides a 27th configuration residing in the linear semiconductor substrate fabricating method, characterized in that the or each thin film formed on the fiber is the semiconductor thin film.

The present invention provides a 28th configuration residing in the linear semiconductor substrate fabricating method, characterized in that the semiconductor thin film is formed before the fiber is contacted with a solid matter.

The present invention provides a 29th configuration residing in the linear semiconductor substrate fabricating method, characterized in that the fiber is formed with at least a part of the or each thin film between the heating furnace or the crucible and the withdrawer.

The present invention provides a 30th configuration residing in the linear semiconductor substrate fabricating method, characterized in that the semiconductor thin film is formed by a CVD method utilizing heat, electromagnetic induction, light, or the like.

The present invention provides a 31st configuration residing in the linear semiconductor substrate fabricating method, characterized in that the semiconductor thin film is formed by using a thermal CVD method which utilizes a heat of the drawn fiber.

The present invention provides a 32nd configuration residing in the linear semiconductor substrate fabricating method, characterized in that formation of the semiconductor thin film is conducted in a reaction furnace which is integral with the heating furnace or in a reaction furnace which is separate from the heating furnace.

The present invention provides a 33rd configuration residing in the linear semiconductor substrate fabricating method, characterized in that the semiconductor thin film is formed in a state between a substantially atmospheric pressure state and a pressurized state.

The present invention provides a 34th configuration residing in the linear semiconductor substrate fabricating method, characterized in that the drawn fiber is coated with a resin or liquid matter including deposition particles followed by firing or melting by a heating furnace, to thereby form the desired semiconductor thin film.

The present invention provides a 35th configuration residing in the linear semiconductor substrate fabricating method, characterized in that the semiconductor thin film is formed by coating a molten liquid onto the fiber, the molten liquid being obtained by heating a material to be deposited, to a temperature at or higher than a melting point of the material.

The present invention provides a 36th configuration residing in the linear semiconductor substrate fabricating method, characterized in that there is provided a step for growing a grain diameter of a depositedly formed crystal grain by providing the crystal grain with an energy such as light, heat, electromagnetic induction, or the like, before the fiber deposited with the film is withdrawn to the withdrawer.

The present invention provides a 37th configuration residing in the linear semiconductor substrate fabricating method, characterized in that there is provided a step for irradiating laser light to thereby conduct recrystallization, after fiber-drawing.

The present invention provides a 38th configuration residing in the linear semiconductor substrate fabricating method, characterized in that in the step for growing the crystal grain, the deposited semiconductor thin film is passed through an ambience including a temperature distribution with a temperature lowered in a fiber-drawing direction from a temperature at or higher than a melting point of the deposited semiconductor thin film.

The present invention provides a 39th configuration residing in the linear semiconductor substrate fabricating method, characterized in that there is conducted a procedure to enlarge the crystal grain of the formed semiconductor thin film, during the fiber-drawing step or during another step, to thereby bring the grain diameter of the crystal grain to $\phi 40$ microns or more.

The present invention provides a 40th configuration residing in the linear semiconductor substrate fabricating method, characterized in that there is formed an $SiO_2$ film or $Si_3N_4$ film as a second layer.

The present invention provides a 41st configuration residing in the linear semiconductor substrate fabricating method, characterized in that second layer and third layer are provided by a combination of an $SiO_2$ film and an $Si_3N_4$ film.

The present invention provides a 42nd configuration residing in, in a fiber-drawing method comprising the steps of:

melting a glass parent material worked into a desired shape within a heating furnace and spinning the material, or melting a glass raw material within a heated crucible and spinning the material, to thereby produce a fiber;

withdrawing the spun and produced fiber by a withdrawer while controlling a withdrawing speed of the fiber, or a feeding speed of the parent material, or both, so that the spun fiber has a constant outer diameter; and winding up the fiber by a winder;

a linear substrate fabricating method for producing the linear substrate, characterized in that the linear substrate fabricating method comprises the step of:

reducing a surface of the spun fiber to thereby form the semiconductor thin film made of silicon.

The present invention provides a 43rd configuration residing in the linear semiconductor substrate fabricating method, characterized in that there is added a step for growing a grain of the silicon forming the semiconductor thin film.

The present invention provides a 44th configuration residing in the linear semiconductor substrate fabricating method, characterized in that the step for growing the grain of the silicon comprises two or more steps including a nucleus generation step, and a crystal growth step.

The present invention provides a 45th configuration residing in the linear semiconductor substrate fabricating method, characterized in that the heating temperature is set within a range of 400° C. to 1,000° C. in the nucleus generation step, and within a range of 1,000° C. to 1,500° C. in the crystal growth step.

The present invention provides a 46th configuration residing in the linear semiconductor substrate fabricating method, characterized in that the step is configured to change a deposition rate in terms of a position in a longitudinal direction.

The present invention provides a 47th configuration residing in the linear semiconductor substrate fabricating method, characterized in that there is provided a coating step before the fiber is withdrawn by the withdrawer.

The present invention provides a 48th configuration residing in a method of fabricating a device from a semiconductor element or from a composite element including combined semiconductor elements, characterized in that the method comprises the steps of:

integrating the linear semiconductor substrate into a flat plane shape, cylindrical shape, or the like to thereby obtain an integrated substrate; and conducting a whole or part of various procedures for fabricating the device, including cleaning, etching, depositing, patterning procedures, and the like.

The present invention provides a 49th configuration residing in the method for fabricating a device, characterized in that the step of forming the integrated substrate is constituted of:

means for drawing out the coated linear semiconductor substrate wound on a bobbin, at a constant tension;

means for fixing the linear semiconductor substrate onto an integrated-substrate holder;

integrated-substrate holder moving means for moving the integrated-substrate holder to thereby arrange the linear semiconductor substrate at intervals of predetermined spacings; and means for cutting the linear semiconductor substrate.

The present invention provides a 50th configuration residing in, in a fiber-drawing method comprising the steps of:

melting a glass parent material in a heating furnace and spinning the material, or melting a glass raw material within a heated crucible and spinning the material, to thereby produce a fiber;

withdrawing the spun fiber by a withdrawer while controlling in a manner that the fiber has a constant outer shape; and winding up the fiber by a winder;

a linear solar cell fabricating method, characterized in that the linear solar cell fabricating method comprises the step of:

forming a part or whole of an internal electrode and of semiconductor layers to be matured into a solar cell, between the heating furnace or the crucible and the withdrawer.

The present invention provides a 51st configuration residing in the linear solar cell fabricating method, characterized in that there is provided a step for forming an intermediate layer between the fiber and the internal electrode.

The present invention provides a 52nd configuration residing in the linear solar cell fabricating method, characterized in that the semiconductor layers are formed by supplying semiconductor raw material gases into a heating furnace for semiconductor film deposition.

The present invention provides a 53rd configuration residing in the linear solar cell fabricating method, characterized in that at least a part of the semiconductor layers is deposited by coating semiconductor particles dispersed in a solvent onto the running fiber, followed by drying and heating.

The present invention provides a 54th configuration residing in a fiber type solar cell fabricating method comprising the steps of:

forming semiconductor layers to be matured into a solar cell on a linear substrate (fiber, wire);

appropriately conducting procedures of electrode formation, element separation, and inter-element wiring; and forming one or more elements in a longitudinal direction of the linear substrate, thereby establishing a solar cell.

The present invention provides a 55th configuration residing in a fiber type solar cell fabricating method comprising the steps of:

adopting a linear substrate comprising a fiber-shaped glass backing formed with an internal electrode, and/or an N type or P type semiconductor layer to be included in a solar cell; and conducting a process to bring the linear substrate into a solar cell, by achieving at least procedures: to deposit a semiconductor having a polarity opposite to that of the linear substrate, or to form a semiconductor having a relatively high resistance and deposit or dope a semiconductor having a polarity opposite to that of the linear substrate, thereby forming elements; to separate the elements from each other; and to form electrodes between the elements, respectively.

The present invention provides a 56th configuration residing in a fiber type solar cell fabricating method characterized in that the method comprises the step of:

adopting a linear substrate comprising a linear substrate formed with a part or whole of electrodes, semiconductor films, and the like constituting solar cell elements to thereby implement solar cell procedures, to fabricate a linear solar cell.

The present invention provides a 57th configuration residing in a fiber type solar cell fabricating method comprising the steps of:

fabricating a linear substrate (fiber, wire) or linear substrate;

cutting the linear substrate or linear substrate into predetermined lengths, and integrating them with each other into an integrated substrate; and conducting required procedures for fabricating solar cell elements on the integrated substrate, thereby fabricating a solar cell.

Effect of the Invention

According to the present invention, there is introduced a concept of a linear substrate into a field of semiconductor substrate for the first time, it becomes possible to decrease a thickness of a semiconductor layer down to a required minimum, to thereby drastically decrease a raw material cost of the semiconductor substrate. Further, high melting point backings such as quartz glass or the like are each used as the linear substrate to thereby enable usage of a thermal process in an ordinary pressure state or pressurized state, to realize fabricating of linear semiconductor substrates simultaneously in a high speed manner and a mass-production manner, thereby allowing for a decreased fabricating cost. Furthermore, the linear semiconductor substrates are each made to have a cross section in a rectangular shape, polygonal shape or the like, thereby enabling a plurality of faces of each linear semiconductor substrate to be sterically formed with devices, circuits, and/or wirings, respectively, to thereby remarkably improve an integration ratio of a chip (steric chip, or 3-dimensional chip).

Moreover, the present invention is configured to adopt a procedure to fabricate devices after segmenting the linear substrate, to thereby enable production of the devices at a higher throughput in a manner to remarkably downsize segmented substrates (substrate size of ⅕ to 1/20), thereby allowing for a drastically decreased equipment cost.

Furthermore, according to present invention, the linear semiconductor substrate is applied to a solar cell to thereby enable crystal grain diameters of silicon to be made greater than the conventional, and there is realized multiplex reflection of light within the linear semiconductor substrate to thereby allow for realization of a power generation efficiency of about 20% at the maximum. Moreover, adoption of the linear semiconductor substrate enables a weight of solar cell to be remarkably decreased (about 1/10).

BRIEF DESCRIPTION OF DRAWINGS

FIG. 5(a) shows an example of a linear substrate having a hexagonal cross section, and FIG. 5(b) shows another example of a linear substrate having an octagonal cross section.

FIG. 6(a) shows a structure of the linear solar cell of the fifth embodiment. FIG. 6(b) is a cross-sectional view of the linear solar cell.

FIG. 7(a) shows a structure of the linear solar cell of the sixth embodiment. FIG. 7(b) is a cross-sectional view of the linear solar cell.

FIG. 9(a) is a view of an example of a solar cell module, and FIG. 9(b) is a constitutional view of the solar cell system where the solar cell module is used as an AC electric-power source.

Figure 1:
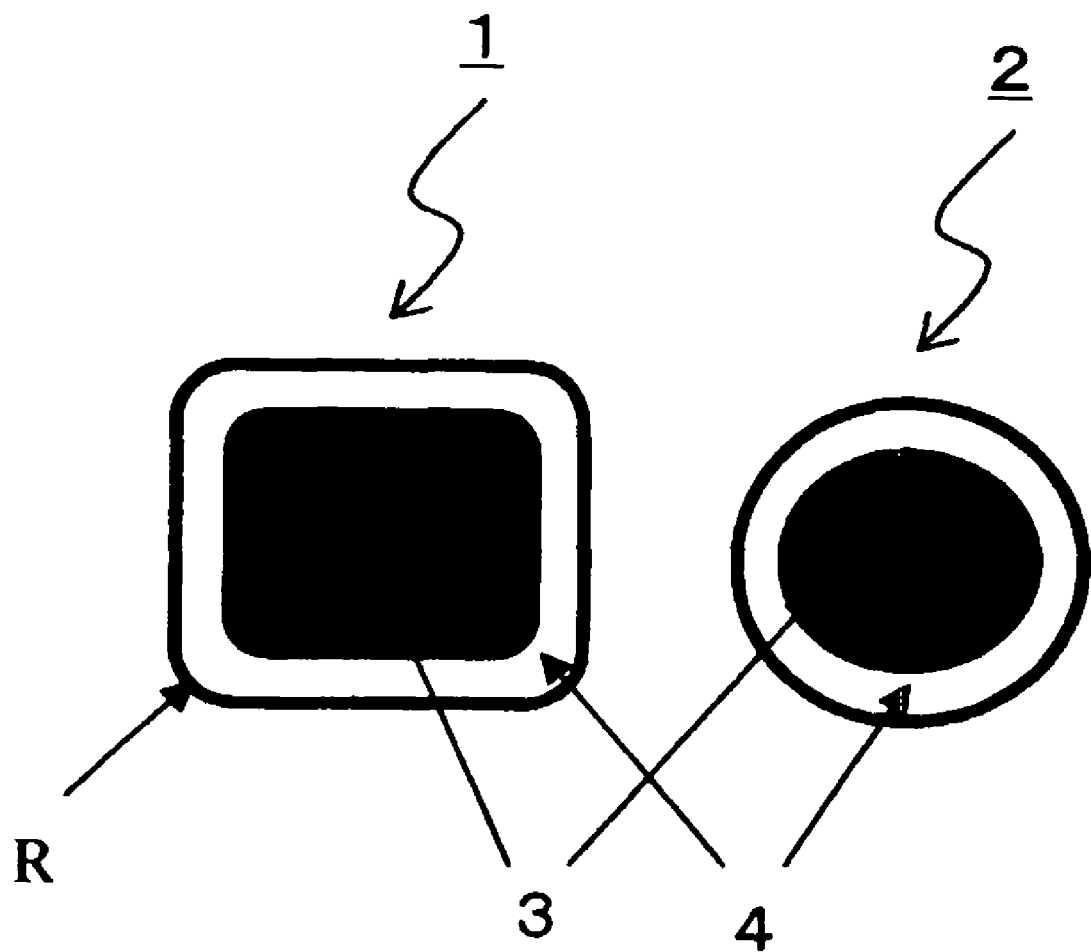
FIG. 1 is a cross-sectional view of linear substrates according to a first embodiment of the present invention.

EXPLANATION OF REFERENCE NUMERALS 1, 2, 5, 6, 8, 9 . . . linear semiconductor substrate
3, 22, 41, 51 . . . quartz glass (fiber)

4, 10, 11, 23 . . . polycrystalline silicon
7 . . . thin film
21 . . . semiconductor device
24 . . . gate insulating film
25 . . . inter-layer insulating film
26 . . . electric current supplying source
27 . . . signal line
31 . . . silicon device
32, 58 . . . insulating film
33 . . . protective film
34, 45, 55 . . . electrode
35, 47, 57 . . . wiring
36 . . . mount board
37 . . . wiring of mount
42, 53 . . . P type polycrystalline silicon
43, 52 . . . P+ type polycrystalline silicon
44, 54 . . . N+ type polycrystalline silicon
46, 56 . . . solar cell element
61, 72, 79 . . . linear solar cell
62, 73 . . . reflective plate
63 . . . anti-reflection film
71 . . . solar cell module
74 . . . discharge/charge controller
75 . . . inverter
76 . . . battery
77 . . . load
78 . . . solar cell
101 . . . preform
102 . . . first heater
103 . . . second heater
104 . . . third heater
105 . . . fourth heater
106 . . . reaction furnace core pipe
107, 108 . . . exhaust port
109 . . . cooling apparatus
110 . . . resist coating portion
111 . . . resist hardening portion
112 . . . capstan
113 . . . double spooler
121 . . . fiber-drawing furnace
122 . . . reaction furnace
123 . . . coupling tube
131, 132, 133 . . . supply port
141 . . . coating apparatus
142 . . . melting/solidifying portion
151 . . . linear substrate fabricating process
152 . . . segmenting process
153, 162 . . . device fabrication process
154, 163 . . . modularizing process
155 . . . roller substrate
161 . . . linear substrate/backing fabricating process
164 . . . linear substrate supply bobbin
165 . . . coating removal step
166 . . . semiconductor deposition step
167 . . . doping step
168 . . . element separation step
169 . . . electrode formation step
170 . . . cutting step

BEST MODE FOR CARRYING OUT THE INVENTION

There will be described preferred embodiments of the present invention, with reference to the drawings.

First Embodiment

There will be firstly explained a linear substrate according to a first embodiment, with reference to the drawings. FIG. 1 is a cross-sectional view of linear substrates according to the first embodiment. The linear substrates of the present invention each comprises at least one desired thin film formed on or around a linear substrate having a length ten or more times greater than a width, thickness, or diameter of the linear substrate itself. Although FIG. 1 shows only cross sections of the linear substrates, the linear substrates of the present invention each have a sufficient length more than ten times greater than a width, thickness, or diameter of the illustrated cross section.

In the first embodiment, there will be described a linear semiconductor substrate to be used as a semiconductor substrate, among linear substrates. FIG. 1 shows linear semiconductor substrates 1 and 2 each comprising a polycrystalline silicon (p-Si) 4 as a semiconductor thin film deposited on an associated quartz glass backing 3. Further, the linear semiconductor substrates 1 and 2 are examples having rectangle and circular cross-sectional shapes, respectively.

Cross-sectional shapes of the linear semiconductor substrates possibly include: a circular shape; rectangular or polygonal shapes, such as a square or rectangle, having R-ed (radiused) corners; a shape provided by combining a semicircle and a rectangle; a shape provided by combining a curved face and a rectangle; and the like. In case of the rectangular or polygonal shapes having R-ed (radiused) corners, it is desirable that the ratio (=R/[length of straight portion]×100) between each R at a corner and a length of a straight portion is 10% to 50%. It is also possible to provide a cross section having a center hole. In case of rectangle, polygonal shapes and the like, it is possible to form a device, circuit, and the like at each face, thereby enabling improvement of an integration ratio as compared with a planar substrate.

The linear semiconductor substrates of the present invention can be each used as an alternative of an expensive silicon wafer serving as a conventional two-dimensional semiconductor substrate. In this case, each polycrystalline silicon 4 is to be desirably deposited in a range of 10 nm (desirably 50 nm or more) to 1,000 nm, and crystal grain diameters are desirably between 10 μm inclusive and 1,000 μm inclusive.

In case of forming a device, circuit, or the like within one grain boundary, there is required a grain boundary size of 10 μm at the minimum in consideration of a device size and an alignment accuracy, though such required grain boundary sizes depend on types of devices. Adopting a substrate having a grain boundary size larger than a device size enables formation of a device, circuit, or the like within the grain boundary, thereby enabling affection by the grain boundary to be lowered. Particularly, in case of an FET device, existence of a boundary face at a gate portion considerably deteriorates a high-frequency property, a pressure-resistant property, and the like of the device.

The linear semiconductor substrate 1 or 2 is also desirable as a substrate for a solar cell, and in that case, the P type or N type polycrystalline silicon 4 desirably has a thickness of 0.5 μm (desirably 3 μm or more) to 50 μm, and a crystal grain diameter of 10 μm (desirably 50 μm or more) to several millimeters. When the linear semiconductor substrate of the present invention was used as a substrate of a solar cell, there was obtained a conversion efficiency of 10% to 20%.

In addition to quartz glass, usable as a linear substrate of the linear substrate present invention, are: high melting point materials such as ceramics including multicomponent glass, sapphire, alumina, carbon, silicon carbide, and the like; metal materials such as aluminum, copper, steel, tungsten, molybdenum, alloys thereof; and the like. It is desirable to adopt a material as a linear substrate, which has a melting point equal to or higher than a melting point of a material to be used for deposition. In case of adoption of metal materials, reactions thereof with semiconductor materials are caused at high temperatures, thereby requiring formation of an intermediate layer which does not react with an oxide film nor semiconductor. Further, in case of adoption as a substrate for a solar cell, it is desirable to adopt a material as a linear substrate which is transparent to the sunlight.

In case of quartz based glass, it is possible to adopt one doped with a network formation material such as boron (B), aluminum (Al), fluorine, germanium (Ge), titanium (Ti), phosphorus (P), or the like, so as to adjust a difference between thermal expansion coefficients of the quartz based glass and a semiconductor substrate. These parent materials can be produced by a vapor phase axial deposition (VAD) method, outside vapor phase deposition (OVD) method, or the like for producing optical fiber parent materials. It is of course possible to produce the parent materials, by a method other than these methods.

Further, in addition to silicon, semiconductor thin films may be made of: compound semiconductors such as GaAs, InP, GaN, or the like; oxide semiconductors; a so-called wide bandgap semiconductor; or the like. Conceivable as usage of linear semiconductor substrates adopting these semiconductors, are substrates and the like for electronic devices, IC's, light emitting devices, light receiving devices, and the like.

Second Embodiment

Figure 2:
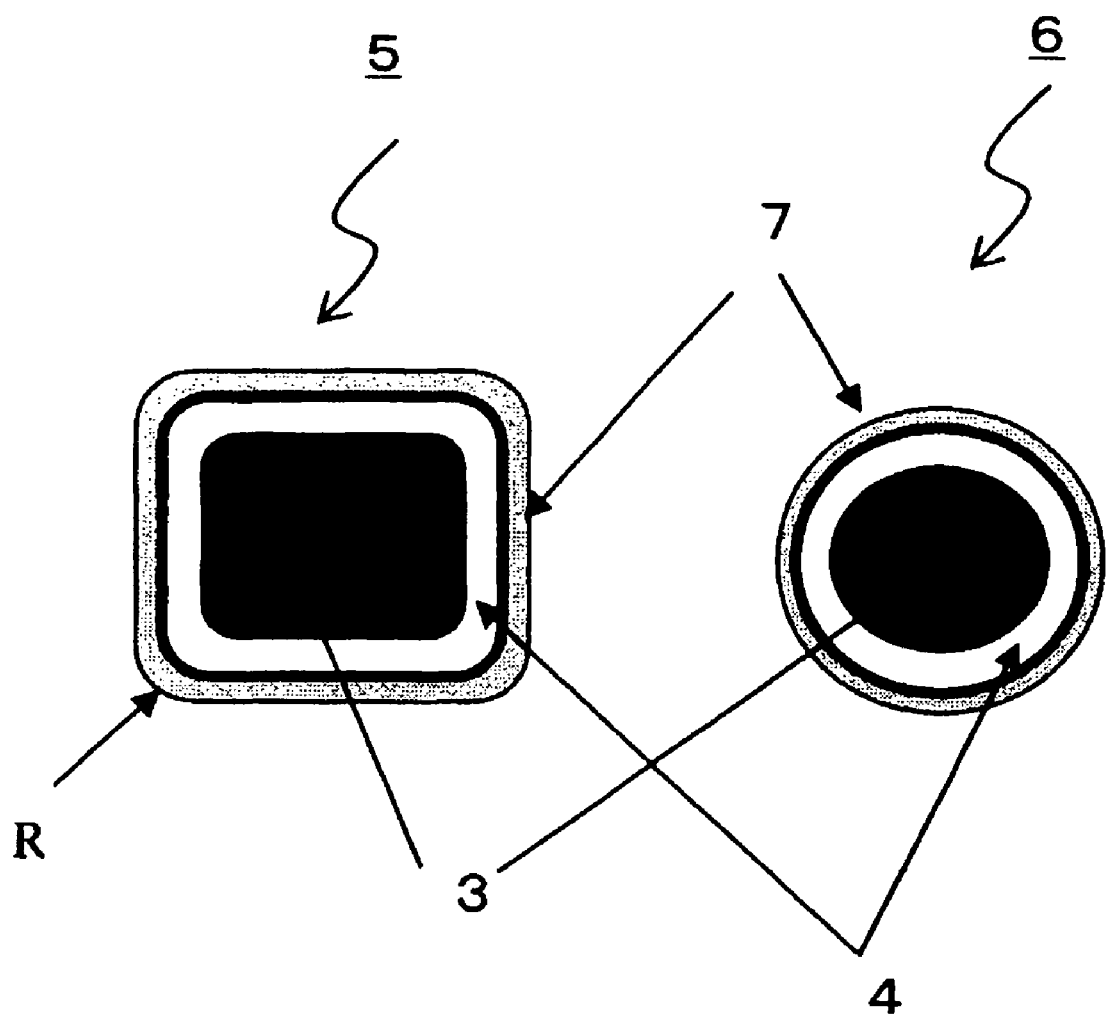
FIG. 2 is a cross-sectional view of linear semiconductor substrates according to a second embodiment of the present invention.

FIG. 2 is a cross-sectional view of linear semiconductor substrates according to a second embodiment. The second embodiment embraces linear semiconductor substrates 5 and 6 comprising the linear semiconductor substrates 1 and 2 of the first embodiments, respectively, as well as additional thin films 7 formed thereon, respectively. Each thin film 7 is provided by depositing an oxide film, thermally-oxidized film, nitride film, or the like in a range of several nanometers to 100 nm, so as to protect the associated polycrystalline silicon 4 inside it. Examples of the thin film 7 include $SiO_2$, $Si_3N_4$, and the like. Such $SiO_2$ comprises a thermally-oxidized film or is formed by a thermal CVD method.

Third Embodiment

Figure 3:
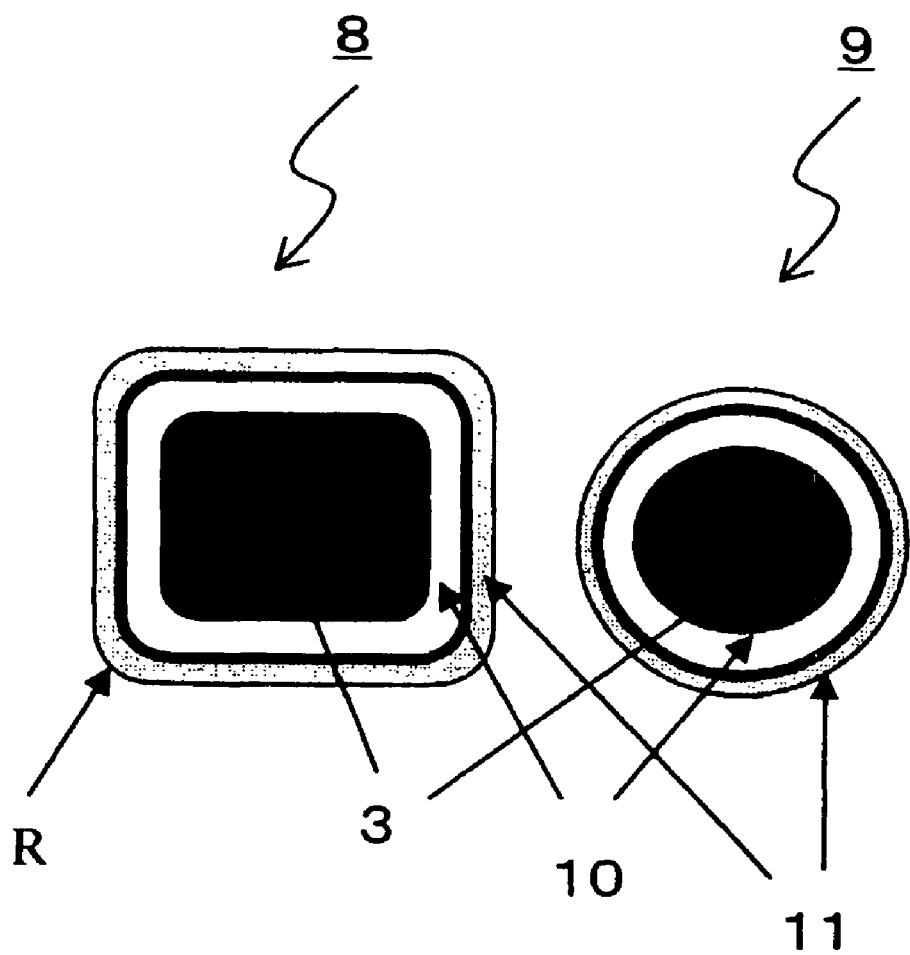
FIG. 3 is a cross-sectional view of linear semiconductor substrates according to a third embodiment of the present invention.

FIG. 3 shows a cross-sectional view of linear semiconductor substrates according to a third embodiment. The third embodiment embraces linear semiconductor substrates 8 and 9 each comprising a quartz glass backing 3, a semiconductor thin film of polycrystalline silicon 10 deposited on a surface of the quartz glass backing 3, and another semiconductor thin film of polycrystalline silicon 11 formed on the semiconductor thin film of polycrystalline silicon 10. The polycrystalline silicon 10 as the first semiconductor thin film is doped with boron (B), aluminum (Al), or the like as a P type dopant, while the polycrystalline silicon 11 as the second semiconductor thin film is doped with phosphorus (P), bismuth (Bi), or the like as an N type dopant. The linear semiconductor substrates of the present invention can be each adopted as a substrate for a solar cell, and there was obtained a conversion efficiency of 12% to 15% when the polycrystalline silicon 10 thin film as the first semiconductor thin film had a thickness of 2 μm and the polycrystalline silicon 11 as the second semiconductor thin film had a thickness of 0.2 μm.

In the first through third embodiments, although there have been described examples each including the semiconductor thin film as the thin film to be formed on the surface of the associated quartz glass backing 3 as the linear substrate, the thin films are not limited to the semiconductor thin films, respectively.

Mainly desirable as substrates for an organic EL, an organic EL of fiber type, and the like, are linear substrates each including the thin film provided by depositing a transparent electroconductive film (ITO, ZnO, $SnO_2$) in a range of 50 nm to several hundreds nanometers over the entire circumference to attain a sheet resistance of 50Ω/□ or less.

Further, it is conceivable to provide a linear substrate including, as the thin film, metal (Au, Ag, Cu, Ni, Pt, or the like) deposited in a range of 0.1 μm to 10 μm. In this case, the metal is coated after depositing Ti or Cr at an interface, for an improved adherence between the backing and the metal. The linear substrates of the present invention can be each used mainly at a location where a thermal expansion coefficient at a high temperature is to be lowered, and where electroconductivity is required. Alternatively, it can be used as a reinforcing material, instead of usage as a substrate.

Further conceivable is a linear electroconductive substrate including deposited semiconductor thin films, at least one of which is an electroconductive film, and another of which is a semiconductor thin film formed by coating and hardening a liquid resin. Examples of the resin to be coated include: a resist; an UV curable resin; silicone; oils such as fluorine oil, mineral oil, and the like; greases of the oils; and the like.

In case where the linear substrate for a linear solar cell has a surface formed with an oxide film, it is desirable to form semiconductor layers serving as the solar cell after removing the oxide film.

Fourth Embodiment

Figure 4:
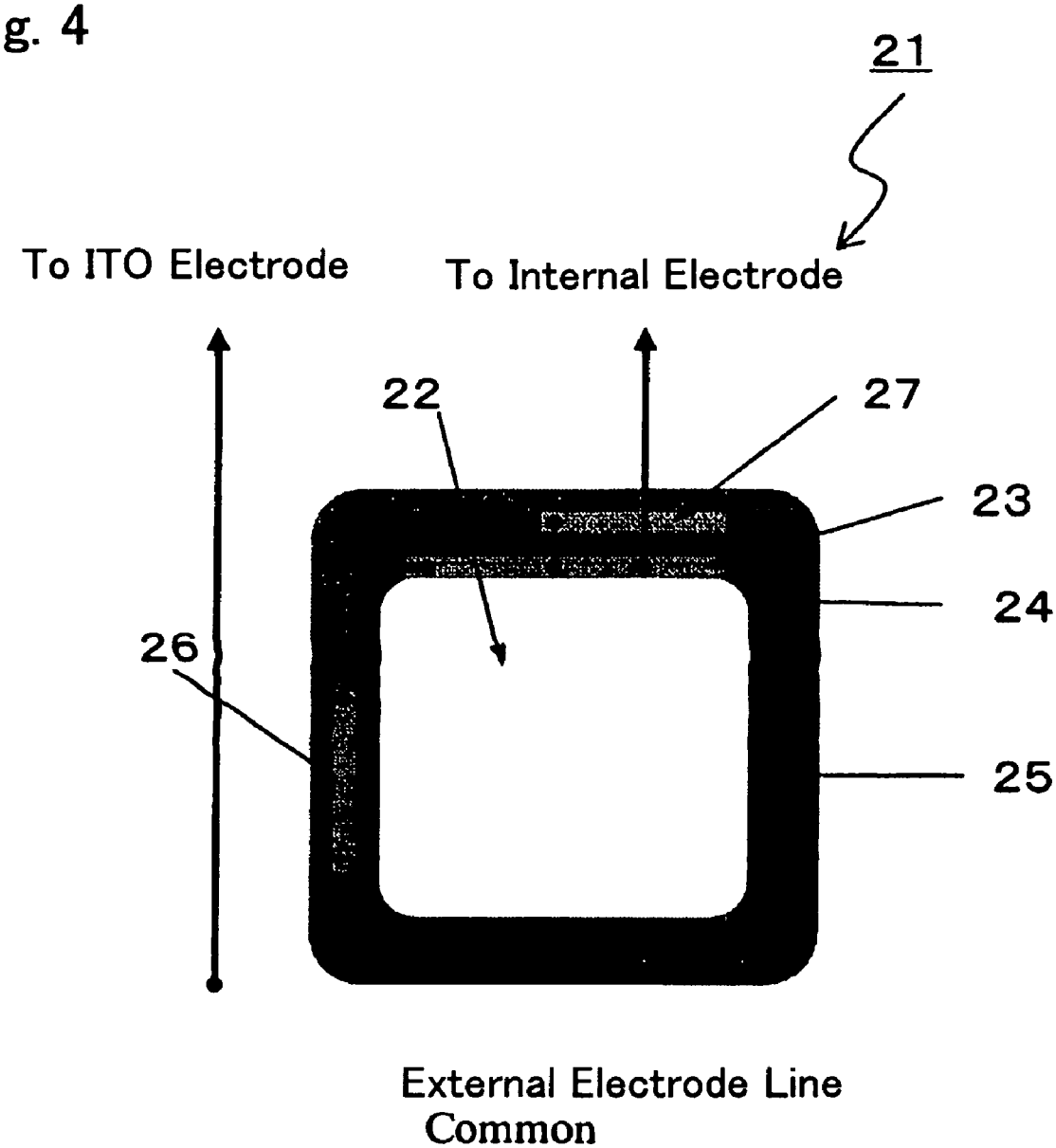
FIG. 4 is a view of a semiconductor device and a device array adopting a linear semiconductor substrate according to a fourth embodiment of the present invention.

FIG. 4 shows an example of a semiconductor device and a device array adopting a linear semiconductor substrate according to a fourth embodiment. FIG. 4 shows a semiconductor device 21 as an example adopting a linear semiconductor substrate having a thermally-oxidized film thereon. Included are a quartz glass 22 as a backing which is a rectangular fiber (having an R of 15 μm at each corner) of 100 μm×100 μm, and a p-Si film 23 having a thickness of 50 μm and a crystal grain diameter of 50 μm. Further included is a gate insulating film 24 which is an $SiO_2$ film obtained by thermally oxidizing the Si thin film and which has a thickness of 50 nm. Furthermore, included is an inter-layer insulating film 25 which is a combination of thermally oxidized $SiO_2$ film and $Si_3N_4$ film, and which has a thickness of 100 nm. The p-Si film 23 of the semiconductor device 21 is formed with an Si circuit portion having an area of 30×30 μm, and the device array has a length of 1,200 mm when devices are arranged at intervals of predetermined pitch widths. The device array of the present invention is mainly used for a TFT for display.

The linear substrates of the present invention can be each used as a substrate of: a semiconductor device provided as a chip formed with electronic elements such as diode, IC, LSI, or the like, optical elements such as LD, PD, LED, or the like, solely, plurally, or combinedly; and a module including it/them incorporated thereinto.

Examples of semiconductor devices and semiconductor device arrays other than the above-described ones, include those each comprising a linear semiconductor substrate and the same or different semiconductor devices or semiconductor device arrays formed on a plurality of surfaces of the linear semiconductor substrate, respectively, thereby enhancing a degree of integration of the semiconductor devices or semiconductor device arrays.

Figure 5:
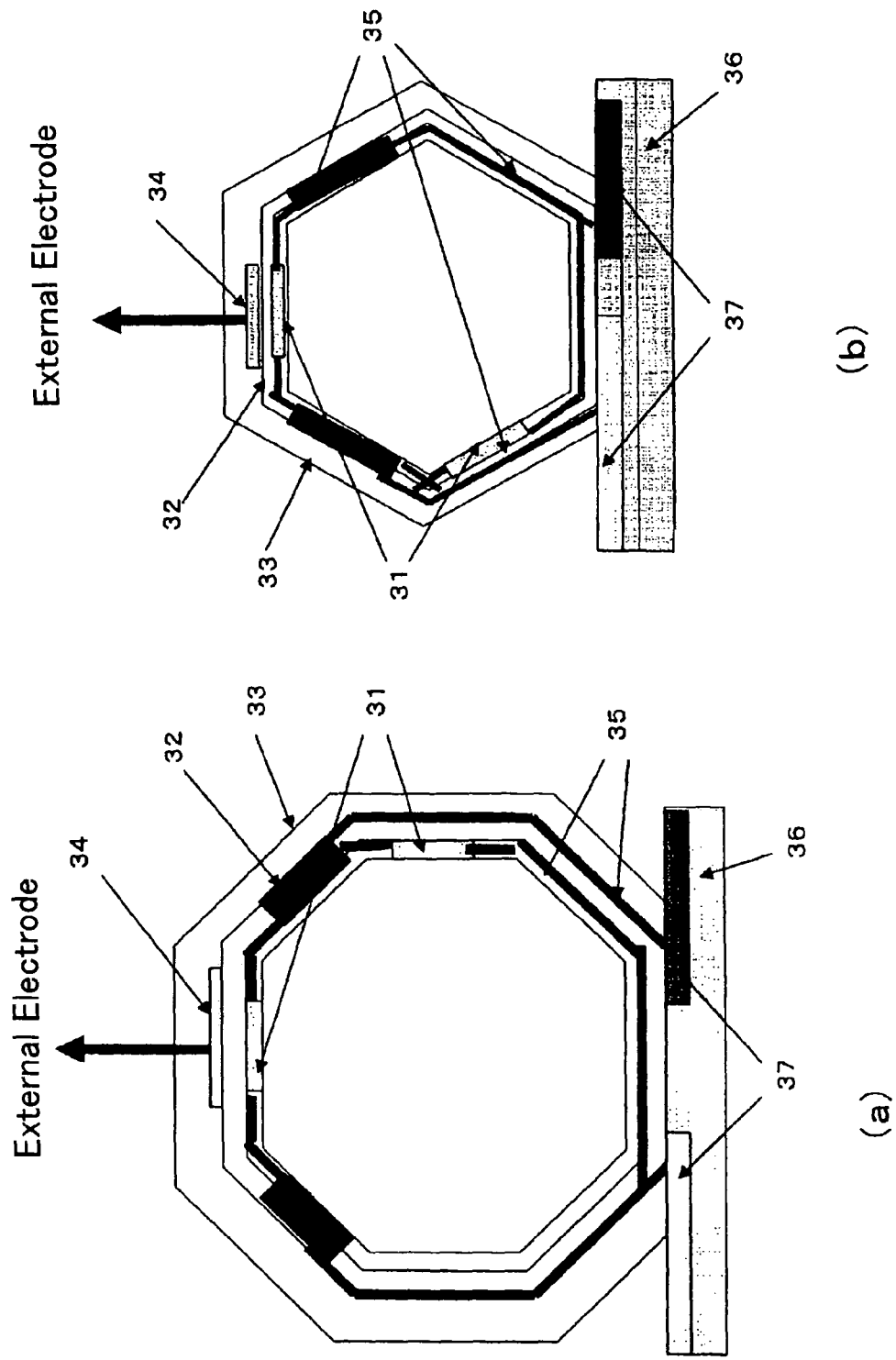
FIG. 5 is a view of a device or a device array including semiconductor devices and the like formed on a plurality of surfaces of a linear substrate of the present invention.

It is possible to adopt a linear substrate having a substantially rectangular or substantially polygonal cross section as the linear substrate of the present invention, thereby providing: a semiconductor steric device (hereinafter called "three-dimensional device") three-dimensionally formed with devices, circuits, or wirings on a plurality of surfaces of the substrate; and a module adopting such a three-dimensional device. Here, it is possible to use one surface or two surfaces of the three-dimensional device, as an electric contact portion(s). FIG. 5 shows examples of the semiconductor steric devices or elements. FIG. 5 shows a mount board having electrode portions connected with wirings of the substrate, respectively. In the device adopting such a linear substrate, wirings can be integrated into one surface of the substrate, thereby enabling collective connection of the wirings by using solder or electroconductive paste. Although such a substrate is one-dimensional, it is brought into a three-dimensional device, thereby enabling realization of an integration ratio of three or more times.

When devices are not directly formed on a linear substrate, it is possible to use the latter as a device mount. In this case, it is possible to integrate, on the linear substrate, materials different from Si of the substrate, and elements such as GaAs, InP, GaN, or the like.

Further, in the three-dimensional device or the module using such a three-dimensional device, at least device portions are formed on the same surface.

Moreover, in the three-dimensional device or the module using such a three-dimensional device, it is desirable that grain boundaries of polycrystalline semiconductor films formed on the linear substrate each have a size of 10 µm to 1,000 µm.

As another embodiment of the linear substrate of the present invention, the thin film(s) to be formed on the fiber as the linear substrate may comprise at least one kind of metal or oxide film, or combination thereof. Here, it is desirable that the metal(s) or oxide film(s) each have a specific resistance at least included in a range of $\Omega cm$ to $10^{-8} \Omega cm$.

Further, as still another embodiment of the linear substrate of the present invention, it is possible to provide a linear substrate by drawing out a metal through a die or by rolling the metal into a linear material. When the metal is used as the linear substrate, it is conceivable to provide a linear substrate including one or more oxide films or metal films formed thereon.

In the linear solar cells of the present invention, it is also possible to use, in addition to silicon, semiconductors such as binary semiconductors like GaAs, ternary semiconductors like $CuInS_2$, or semiconductors like ZnO or $TiO_2$ sensitized by pigment.

Fifth Embodiment

Figure 6:
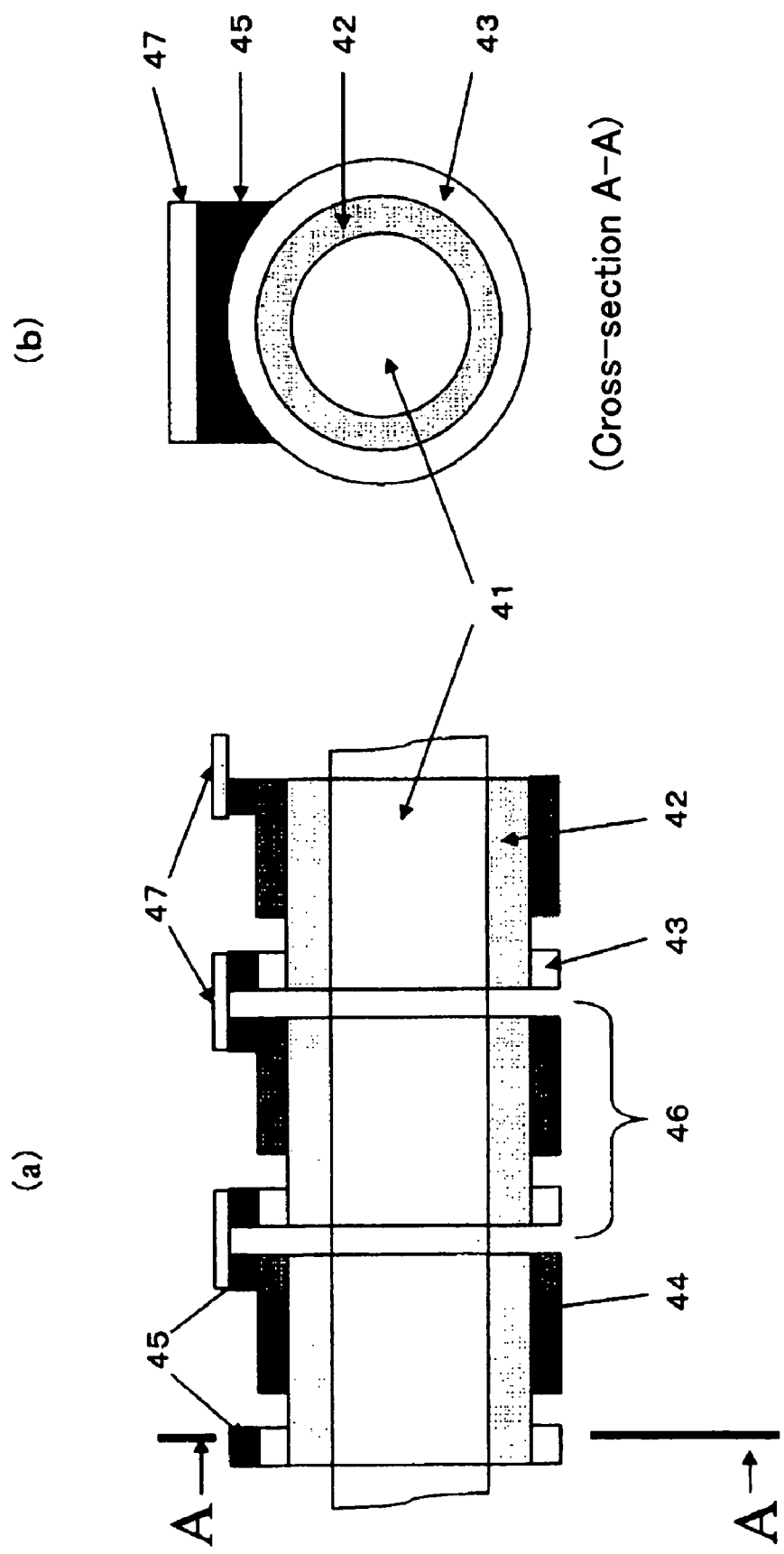
FIG. 6 is a view of an outline of a linear solar cell according to a fifth embodiment of the present invention.

FIG. 6 shows an outline of a linear solar cell according to a fifth embodiment. FIG. 6(a) is a view showing a structure of the linear solar cell of the fifth embodiment, and FIG. 6(b) is a cross-sectional view of the linear solar cell. It includes a quartz glass fiber 41 as a linear substrate, deposited with P type polycrystalline silicon 42 thereon. The latter are each formed with a P+ type polycrystalline silicon 43 and an N+ type polycrystalline silicon 44 at different positions in the longitudinal direction, respectively. This is to decrease resistances relative to electrodes 45 formed thereon, respectively. There are formed a plurality of thus constituted solar cell elements 46 in the longitudinal direction, such that the solar cell elements 46 are separated from each other and series-connected with each other by wirings 47, respectively. The solar cell elements 46 may be configured to be parallel-connected and series-connected with each other in a combined manner, depending on a design of a solar cell module. The wirings 47 are formed at portions in the circumferential direction and substantially straightly aligned in the longitudinal direction.

By using the polycrystalline silicon 42 in the linear solar cell in a manner to grow the former to have a thickness of 0.5 µm or more, preferably 3 µm or more to 50 µm or less, with a crystal grain diameter of 100 µm or more, preferably 500 µm or more, the solar cell is enabled to absorb the sunlight with an excellent efficiency, while allowing a conversion efficiency of about 10% to be improved up to about 15%-18%.

When the films 42, 43, and 44 as semiconductor films are formed of silicon, there was obtained about 0.5V per one solar cell element as a voltage to be generated by power generation. Thus, series-connected 200 pieces of solar cell elements were capable of achieving 100V. It was further confirmed that, series-connecting two sets of linear solar cells of 100V generated 200V. In a household solar cell system in the present state, 100V or more is used.

Sixth Embodiment

Figure 7:
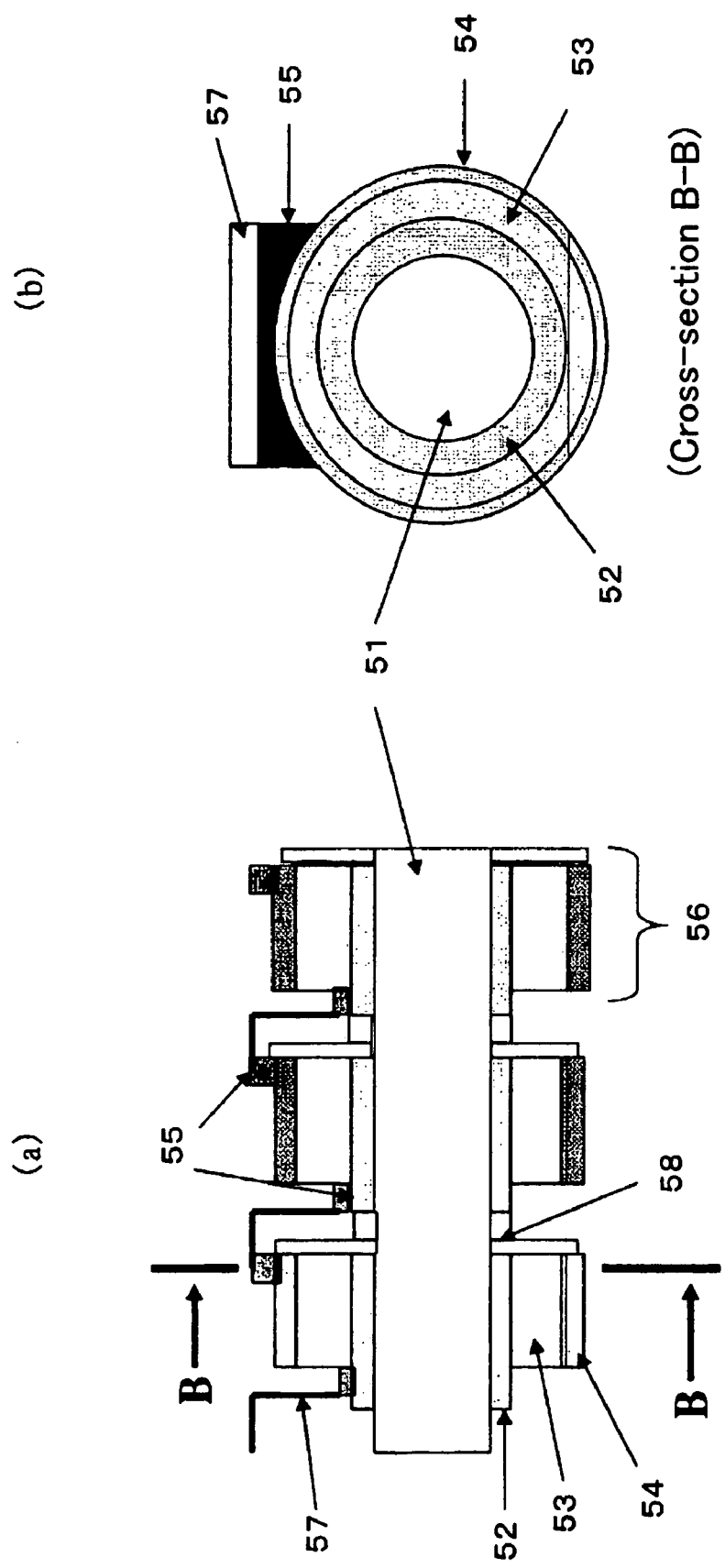
FIG. 7 is a view of an outline of a linear solar cell according to a sixth embodiment of the present invention.

FIG. 7 shows an outline of a linear solar cell as a sixth embodiment having a structure different from that of the fifth embodiment. FIG. 7(a) is a view showing a structure of the linear solar cell of the sixth embodiment, and FIG. 7(b) is a cross-sectional view of the linear solar cell. It includes a linear substrate (quartz glass) 51 deposited thereon with P+ type polycrystalline silicon 52 or W (tungsten) metal as electrodes, respectively.

Subsequently deposited thereon are P type polycrystalline silicon 53, respectively, and further deposited thereon are N+ type polycrystalline silicon 54, respectively, to establish diode structures. Each P+ type polycrystalline silicon 52 and the associated N+ type polycrystalline silicon 54 are formed with metal electrodes 55, respectively, thereby forming a solar cell element 56 having a diode structure in a thickness direction. Sidewalls of the solar cell elements 56 separating them from each other are provided with insulating films 58, respectively, formed of $SiO_2$, $Si_3N_4$, or the like, so as to avoid short circuits of wirings 57. There is fabricated a plurality of thus constituted solar cell elements 56 in the direction of the linear substrate, and the elements are connected with each other by the wirings 57, respectively, thereby establishing the linear solar cell.

Also in the linear solar cell of the sixth embodiment and similarly to the linear solar cell of the fifth embodiment, there were fabricated linear solar cells each having a thickness of 6 µm and a length of 1 m, by using linear substrates 51 having diameters of 0.07, 0.1, and 0.2 mm, respectively. One thread of solar cell was formed with 200 pieces of solar cell elements 56, and 100 threads of such solar cells were parallel-connected to obtain a voltage of about 100V. When the linear substrate 51 had a diameter of 0.07 mm, there was averagedly obtained about 0.01 W with a film thickness of 2 µm, and there was similarly and averagedly obtained about 0.014 W with a film thickness of 6 µm. When the linear substrate 51 had a diameter of 0.1 mm, there was averagedly obtained about 0.015 W with a film thickness of 2 µm, and there was similarly obtained 0.02 W with a film thickness of 6 µm. Further, when the linear substrate 51 had a diameter of 0.2 mm, there was averagedly obtained about 0.03 W with a film thickness of 2 µm, and there was similarly obtained 0.04 W with a film thickness of 6 µm. Note that the above results were confirmed by a solar cell system having a configuration that wirings were laid at a reverse side of a light receiving face while adopting an aluminum mirror plate as a reflective plate.

Although there have been described linear solar cells each having a PN junction or PIN junction in the thickness direction of the associated thin films, it is also possible to form a linear solar cell having an NP junction or NIP junction.

In the cross section of the linear solar cell of the fifth embodiment or the linear solar cell of the sixth embodiment, there has been adopted a quartz glass having a circular cross section as the quartz glass fiber 41 or 51. In case of adoption of such a transparent linear substrate having a circular cross section, incident light is absorbed by the semiconductor films at the surface, and part of the light is transmitted through the semiconductor films since they are thin. The transmitted light is partially reflected by an interface between the transparent linear substrate and the applicable semiconductor film, is partially transmitted through the linear substrate, and is then absorbed by the same semiconductor film. In this way, reflection and absorption are repeated at the interface between the linear substrate and the applicable semiconductor film, thereby obtaining such a remarkable merit of the linear substrate that the light is effectively absorbed irrespectively of the small thicknesses of the semiconductor films. In case of a conventional solar cell adopting a two-dimensional substrate, there was required a film thickness of 20 µm.

As the cross-sectional shape of the linear solar cell, it is conceivable to adopt a polygonal shape, rectangular shape, a combined shape of arc and rectangle, and the like, in addition to the circular shapes shown in FIG. 6 and FIG. 7.

Figure 8:
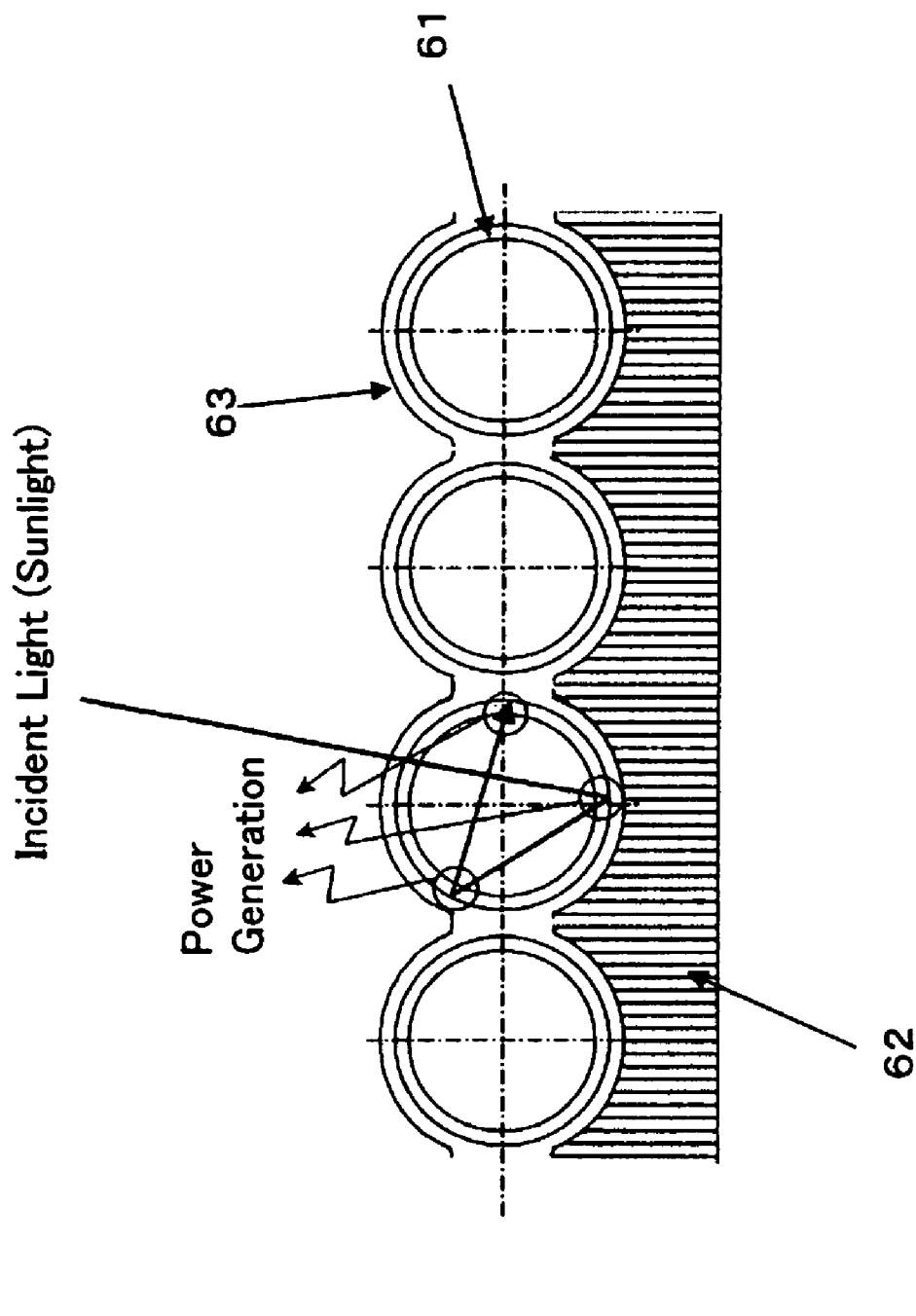
FIG. 8 is a view of a structure of a solar cell module of the present invention.

FIG. 8 shows an example of a solar cell module. It has a structure to support a solar cell array comprising juxtaposed linear solar cells 61 by a reflective plate 62 made of aluminum. The linear solar cells 61 are each formed with an anti-reflection film 63 made of $SiO_2$ or $Si_3N_4$ film. Such a configuration allowed a power generation efficiency of 12-15% to be improved up to 17-20%. Further, taking account of arrangement and handling of the linear solar cells 61, it is also possible for the linear solar cells 61 to each have a polygonal cross section shape such as a rectangular shape or the like, or have a shape including a straight side formed as a part thereof.

Seventh Embodiment

Figure 9:
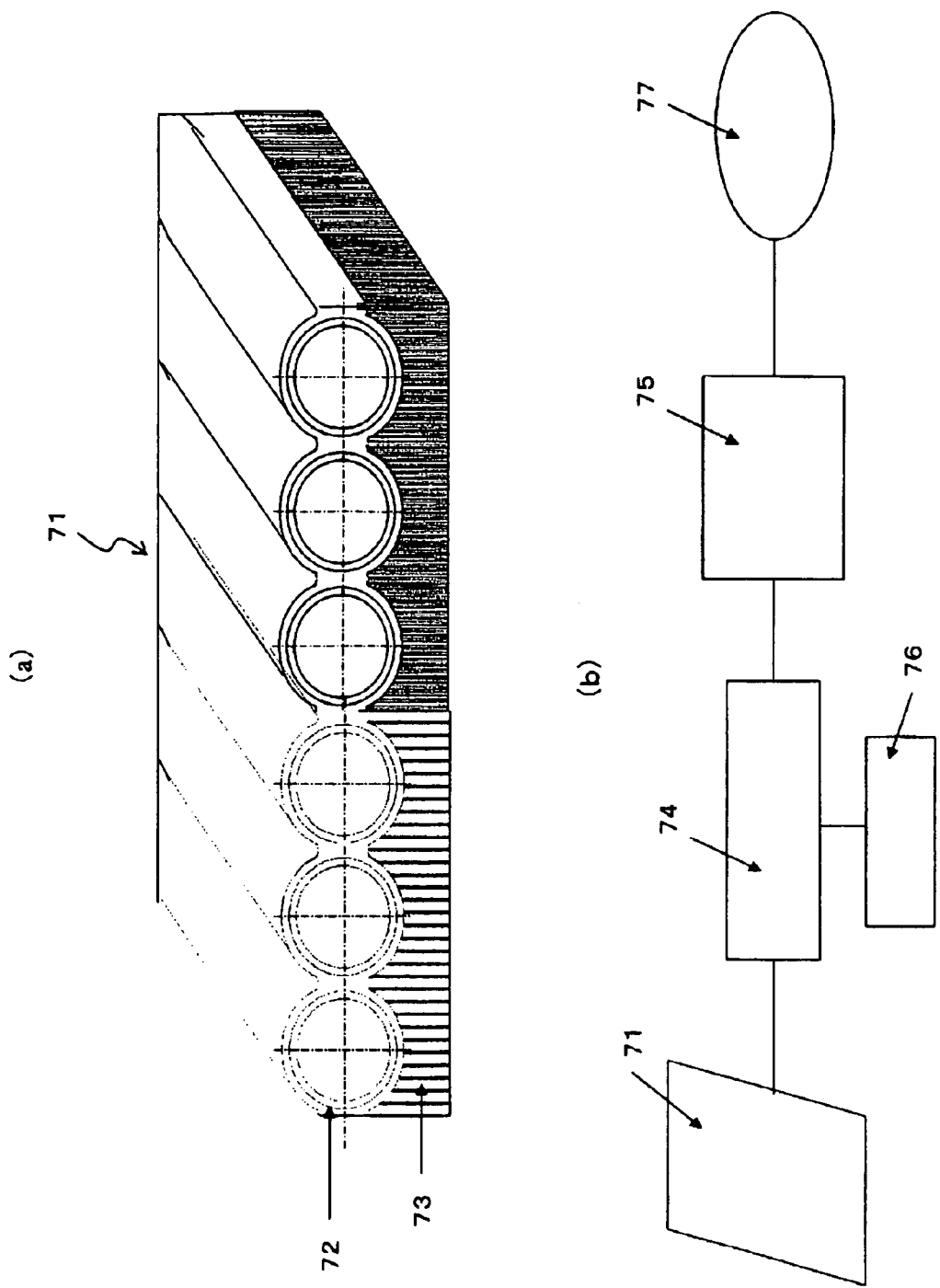
FIG. 9 is a schematic view of a solar cell system adopting linear substrates according to a seventh embodiment of the present invention.

FIG. 9 shows an outline of a solar cell system adopting a linear substrate according to a seventh embodiment. FIG. 9(*a*) shows an example of a solar cell module 71 constituted to include linear solar cells 72 juxtaposed on a reflective plate 73. Further, FIG. 9(*b*) is a view showing a configuration of the solar cell system when the solar cell module 71 is used as an AC electric-power source. The solar cell module 71 is configured to be connected with a discharge/charge controller 74 and an inverter 75, thereby providing a power source to a load 77 of electric equipment or the like. Further, the module is also connected with a battery 76 for storing electric power generated in the daytime.

The solar cell module 71 is to desirably have a thickness between 0.04 mm inclusive and 10 mm inclusive except for the reflective plate 73.

According to the solar power generation system adopting the linear substrates of the present invention, it is possible to produce an extremely light-weighted solar cell module. For example, devices required for a solar cell of 1 $m^2$ have a weight of about 9 kg in case of adoption of two-dimensional glass substrates (4 mm thick), and a weight of about 700 g in case of the linear substrates of the present invention, which means light-weighting down to 1/10 or less. This also allows a solar cell module to be remarkably light-weighted, thereby obtaining a remarkable economical effect to allow for decrease of transportation cost, installation cost, construction cost, and the like by 20% to 30%.

The linear solar cell array of the present invention is packaged into a stand provided with terminals to be connected to wirings, respectively.

Figure 10:
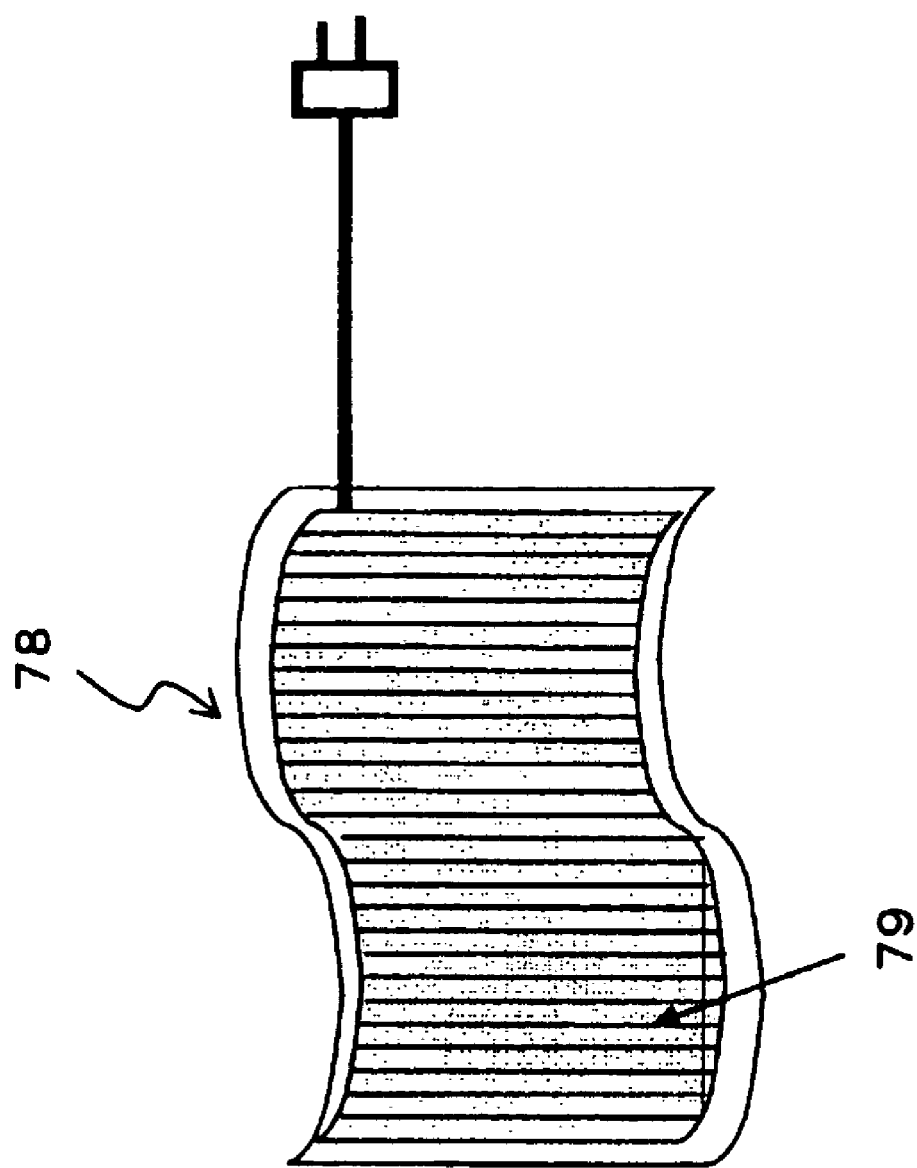
FIG. 10 is a constitutional view of a solar cell in a bamboo blind shape as an embodiment of a solar cell of the present invention.

Since the solar power generation system adopting the linear substrates of the present invention can be light-weighted and is excellent in flexibility simultaneously therewith, it is exemplarily possible to constitute a solar cell 78 in a bamboo blind shape as shown in FIG. 10, a foldable solar cell module (not shown), and the like. In FIG. 10, there are omitted details of wirings for connecting linear solar cells 79 with each other, and the like. The solar cell 78 of the present invention can be produced by interposing, the duly arranged and wired linear solar cells 79, between transparent sheets (such as PET, acrylic resin, vinyl chloride resin, polycarbonate resin, or the like), and by laminating the latter to the former by adhesive or heat sealing. As an applied example, it is conceivable to adopt the solar cell as a sun shade sheet in a vehicular compartment, for example, to thereby rotate a small fan by power generation by the solar cell in a state where passengers are absent, or to thereby cool the interior of the vehicle by connecting Peltier elements to the solar cell. It is also possible to use the solar cell as a blind or bamboo blind in a room to utilize a generated electric power, to thereby drive an electric fan, or to thereby charge a power source of a personal computer or a cellular phone itself, for example.

There will be explained fabricating methods of the linear substrates of the present invention, based on the drawings.

Eighth Embodiment

Figure 11:
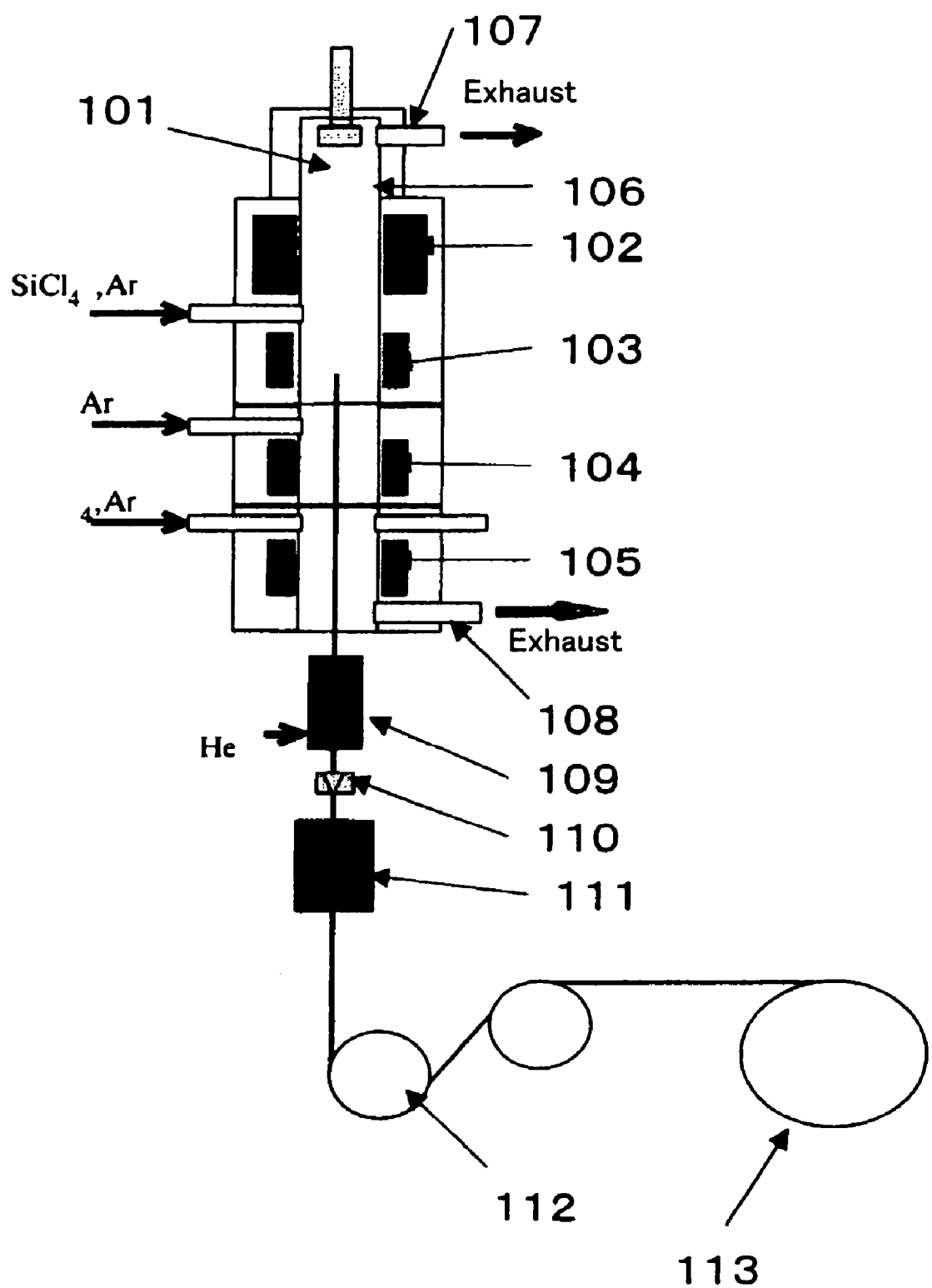
FIG. 11 is an explanatory view of a fabricating method of a linear semiconductor substrate of the present invention.

As an eighth embodiment, there will be explained a fabricating method of the linear substrate of the present invention, with reference to FIG. 11. The present invention utilizes a fiber-drawing technique which is a fabricating technique of an optical fiber for realizing a higher throughput. FIG. 11 shows a first heater 102 for heating and melting a preform (quartz glass parent material) 101, and other heaters 103 through 105 for exemplarily heating a raw material gas, and adjusting temperatures of ambiences. Ambiences in the installed locations of the heaters 102 through 105 are separated from that in the location of the preform 101 by a reaction furnace core pipe 106. Typically used as the reaction furnace core pipe 106 is carbon. Further, at a low temperature location, it is possible to use a reaction furnace core pipe comprising: quartz; SiC; or carbon or SiC having SiC coating (deposited by thermal CVD) applied thereto.

To keep the pressure within the reaction furnace core pipe 106 at the atmospheric pressure or higher, or to establish a pressurized ambience if required, there is supplied an inert gas such as Ar, He, or the like, or a mixed gas thereof into the reaction furnace core pipe 106. Supply of the inert gas has an effect to avoid entrance of atmospheric air into the reaction furnace core pipe 106 and to simultaneously prevent the harmful raw material gas, reaction gas, and the like from flowing out of the reaction furnace core pipe. Note that, in case of deposition of a compound semiconductor, there is supplied: a vapor of a raw material having a higher vapor pressure; a gas including the raw material component; or a mixed gas of the same and an inert gas such as Ar, He, or the like.

The inert gas such as Ar, He, or the like supplied into the reaction furnace core pipe 106 is mainly exhausted through an exhaust port 107 at an upper portion of the reaction furnace core pipe, while the raw material gas or the gas generated by reaction is exhausted through an exhaust port 108 at a lower portion of the reaction furnace core pipe. Preferably, it is desirable to provide shield means, within the reaction furnace core pipe 106, for separating the ambient gases and the raw material gas from each other, thereby preventing them from being mixed with each other. Provided at an exit of the reaction furnace core pipe 106 is a shutter (not shown) for narrowing the exit.

In FIG. 11, the second heater 103 is one provided for reaction, with a configuration that the raw material gas is supplied when the temperature of a quartz glass fiber as a linear substrate is in a range of 1,430° C. to 1,600° C. which is higher than the melting point of 1,412° C. of silicon. It is thus considered that deposited silicon is present in a liquid state on the surface of the fiber. Although the conventional deposition method achieves deposition in vacuum by using PCVD or sputtering, the linear substrate fabricating method of the present invention is remarkably different therefrom in that deposition is achieved in an ordinary pressure state or pressurized state by thermal CVD (or CVD using electromagnetic induction or light). This enables a deposition rate to be drastically improved.

In FIG. 11, the two heaters 104 and 105 at a lower section are provided to grow crystal grain diameters of silicon formed on the quartz glass fiber as the linear substrate. Cooling at an appropriate temperature gradient allows the crystal grain diameters to be grown as the molten silicon is cooled. By virtue of the thermal CVD, it is possible to allow grain boundary sizes to be grown to about 20 to 100 µm. Controlling the temperature gradient commensurately with a fiber-drawing speed of the quartz glass fiber, a deposition thickness of the polycrystalline silicon, and the like, enables to appropriately deal with fluctuation of the fiber-drawing speed, fluctuation of deposition thickness, and the like. It is also possible to change a deposition rate in terms of a position in a longitudinal direction. Note that the process for growing crystal grain diameters of silicon comprises two or more steps including a nucleus generation step, and a crystal growth step. The third heater 104 and fourth heater 105 shown in FIG. 11 correspond to the nucleus generation step and crystal growth step, respectively. Since the nucleus generation has a temperature dependency, it is desirable to set a heating temperature within a range of 400° C. to 1,000° C. in the nucleus generation step. Further, more higher temperatures are desirable for growing crystals, and it is desirable that the heating temperature is set within a range of 1,000° C. to 1,500° C. in the crystal growth step.

The above described linear substrate fabricating method of this embodiment is different from a fiber-drawing method for an optical fiber, in that: the heating furnace has its upper portion of a hermetically sealed type; the raw material gas (raw material gas of $SiCl_4$, $SiHCl_3$, or the like for silicon, and further a doping gas $PCl_3$, $BCl_3$, or the like for solar cell) is supplied by a vapor pressure thereof, by bubbling it by Ar, He gas, or the like, or by directly heating the raw material, in the heating furnace; deposition is achieved in an ordinary pressure state or pressurized state; and there is provided a temperature distribution in the longitudinal direction of fiber drawing, by the plurality of heaters.

Although the reaction furnace core pipe of the eighth embodiment is provided with the four heaters, it is also possible to attain all the functions by a single heater, by changing a heater design.

In FIG. 11, the fiber exiting the fiber-drawing furnace is cooled by a cooling apparatus 109, is coated with a resin, a resist, and the like at a resist coating portion 110 to be used in a step of device fabrication, followed by hardening at a resist hardening portion 111. At the cooling apparatus 109, cooling is conducted by using He gas. The reason why the resin, resist, and the like are coated at the resist coating portion 110, is to protect the deposited film on the quartz glass fiber. Desirably, to be adopted as the resin is an ultraviolet-curable resin or an electron beam curable resin. The deposited film suitably has a thickness in a range of 0.5 µm to 30 µm, and preferably 1 µm to 10 µm. The linear substrate coated with the resin, resist, and the like is drawn out by a capstan 112 and wound onto a double spooler 113. Herein, the double spooler 113 is a winder capable of conducting a changeover from a fully wound bobbin during its winding, to the other empty bobbin without lowering a fiber-drawing speed. Bobbins each have a winding length of 50 km to 200 km, so that fabricating of a linear semiconductor substrate of 1,000 km requires 5 to 20 pieces of bobbins. Fiber-drawing speeds of 5 m/s to 30 m/s are possible.

The linear semiconductor substrate of the present invention has a cross-sectional shape which can be set by previously working the preform 101 into a desired shape. For example, the cross-sectional shape of the quartz glass backing 3 of FIG. 1 is rectangular having R's at corners, respectively, and this can be realized by setting the cross-sectional shape of the preform 101 into a similar rectangle having R's at corners, respectively. Only, the R portions are likely to be enlarged, due to slightly rounded corners by fiber-drawing. Nonetheless, it is possible to restrict the change in cross-sectional shape, by setting the temperature upon fiber-drawing at 2,000° C. or lower. Examples of methods for lowering the temperature upon fiber-drawing to thereby attain a low temperature at about 1,800° C., include prolonging the heater 102 for fiber-drawing in a fiber-drawing direction, setting a plurality of heaters 102 for fiber-drawing, controlling the temperature of the second heater 103 for reaction at a higher level, or the like.

As a method for controlling a cross-sectional shape of the linear semiconductor substrate of the present invention, it is possible to adopt a fiber-drawing technique for a typical optical fiber. Namely, the quartz glass preform 101 worked into a desired shape is heated and melted by the heater 102 for fiber-drawing, and then spun; the shape of the fiber withdrawn by the capstan 112 is measured by an outer diameter measuring equipment or a shape measuring equipment; the fiber is withdrawn by the capstan 112, while controlling the withdrawing speed of the fiber, or the feeding speed of the preform 101, or both, and the fiber is wound up by the winder 113, so that the shape of the fiber is made constant; thereby enabling the cross-sectional shape of the linear semiconductor substrate to be controlled. When the linear semiconductor substrate has a circular cross section, it is possible to restrict the fluctuation of its outer diameter to ±1 µm or less.

Figure 12:
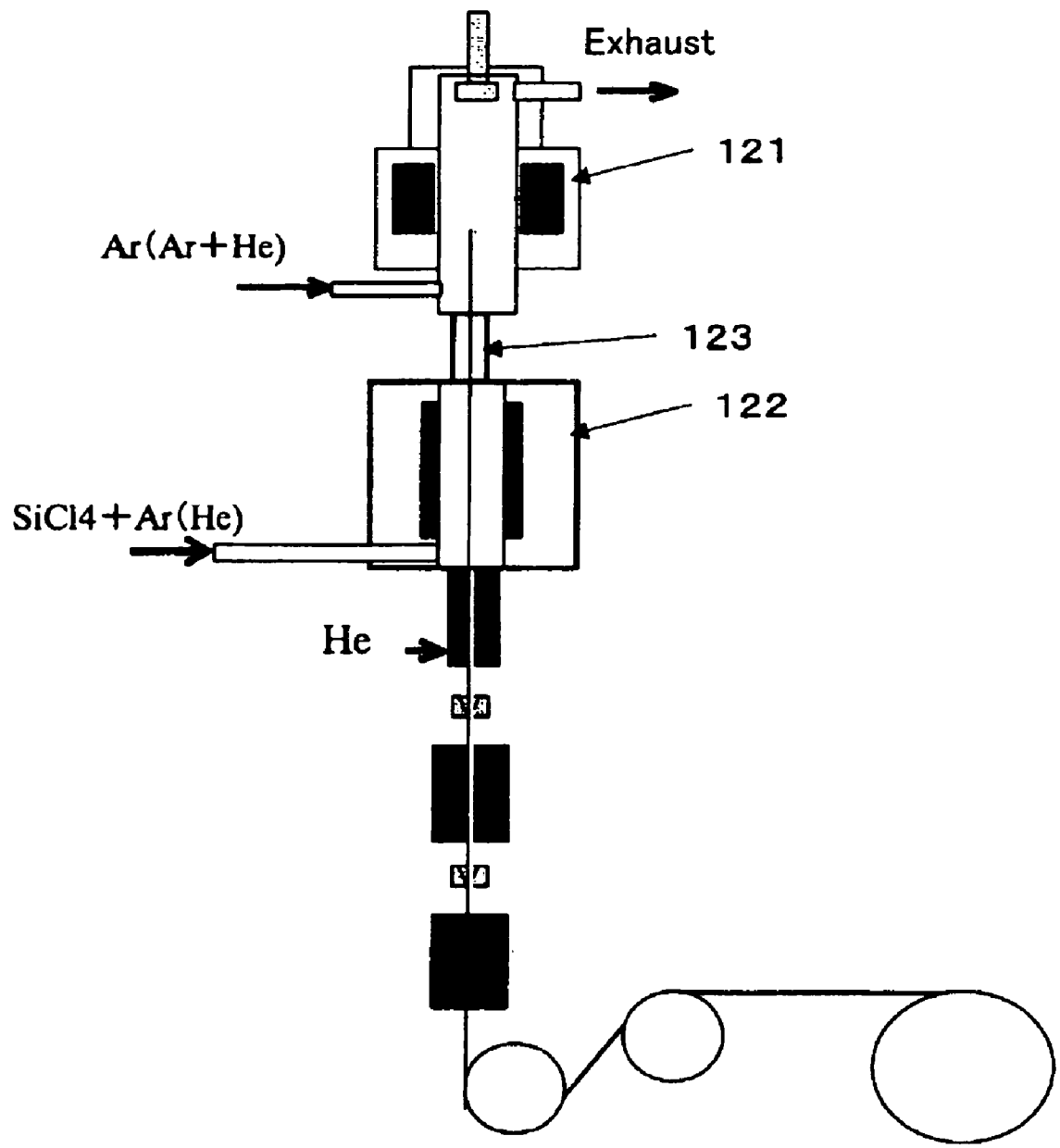
FIG. 12 is an explanatory view of a linear semiconductor substrate of the present invention, including mutually separated fiber-drawing furnace and reaction furnace.

Although the fiber-drawing furnace and the reaction furnace are integrated with each other in the linear substrate fabricating method of the present invention shown in FIG. 11, these may be separated from each other. Shown in FIG. 12 is an embodiment including a fiber-drawing furnace and a reaction furnace separated from each other. This embodiment includes the fiber-drawing furnace 121 and the reaction furnace 122 separated from each other. It is required to ensure airtightness between the fiber-drawing furnace 121 and the reaction furnace 122 lest the atmospheric air or the like moves into the interiors of them, and this embodiment includes a coupling tube 123 provided between the fiber-drawing furnace 121 and reaction furnace 122 to thereby couple them to each other. Alternatively, it is desirable that the furnaces contain ambiences such as inert gas or the like, respectively, to keep pressures within the furnaces higher than the atmospheric pressure, thereby establishing a structure which the atmospheric air never enters.

Instead of growing crystal grain diameters by the two heaters 104 and 105 at the lower section shown in FIG. 11, it is also possible to provide a stage for growing by supplying an energy such as light, heat, electromagnetic induction, or the like, or to provide a stage for irradiating laser light for recrystallization. Adopting laser anneal to thereby irradiate a laser beam to a linear substrate promotes crystal growth (one-dimensional crystal growth) substantially selectively in a scanning direction of the laser beam, thereby enabling a grain boundary to be enlarged.

It is further possible to conduct a procedure to enlarge the crystal grain of the formed semiconductor thin film, during the fiber-drawing step or during another step, to thereby bring the grain diameter of the crystal grain to $\phi 40$ μm or more.

Moreover, it is possible to anneal the deposited film, by prolonging the reaction furnace or by adding a furnace for annealing. The temperature therefor is preferably at or lower than a distortion point of the glass as the parent material. Such a temperature is about 1,100° C. in case of quartz glass, and is about 600° C. to 1,000° C. depending on a dopant concentration in case of a quartz based glass containing a dopant.

Further, it is possible to cause the semiconductor thin film to be formed of silicon, by reducing a surface of the fiber which is spun from the preform 101.

Ninth Embodiment

Figure 13:
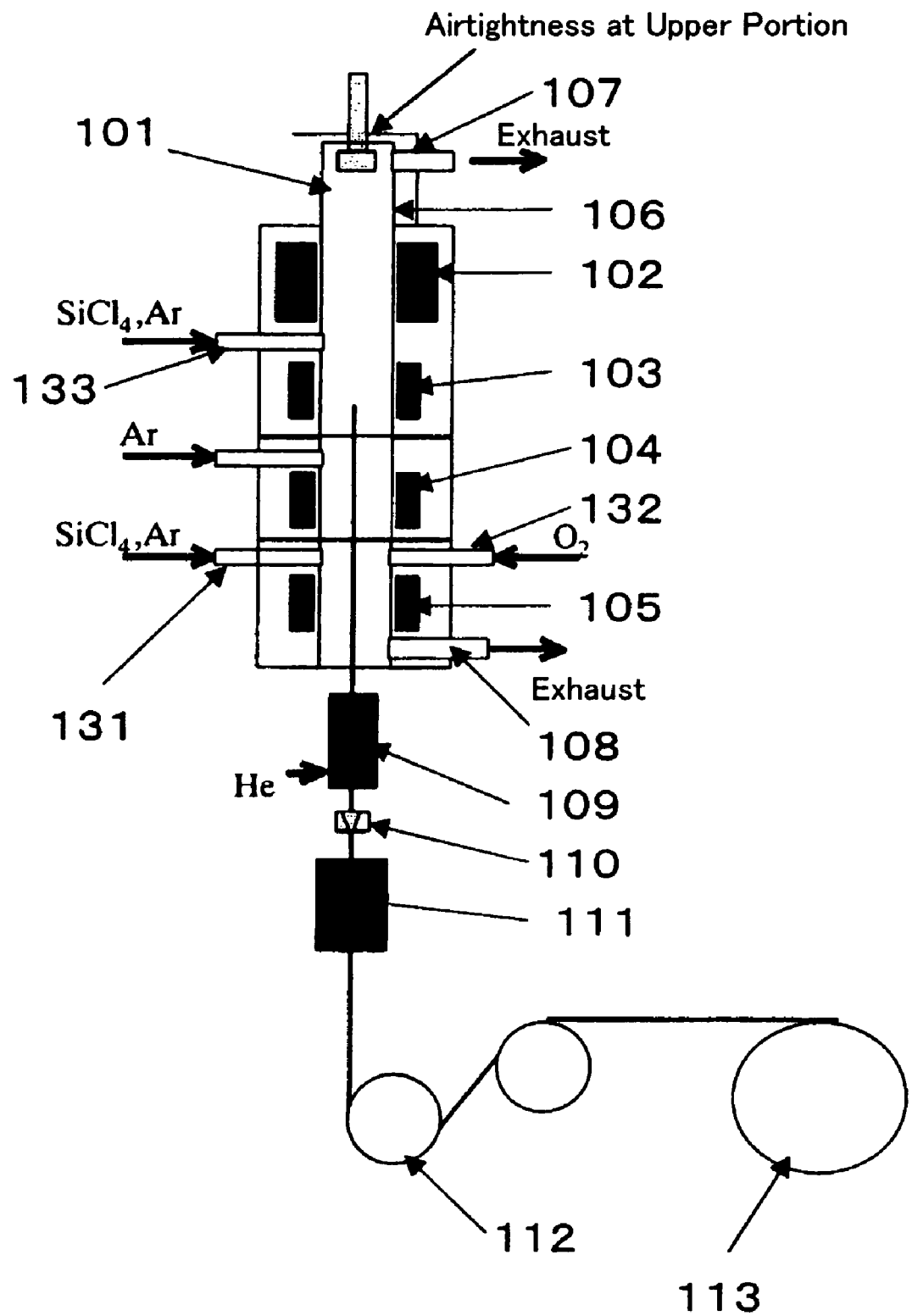
FIG. 13 is an explanatory view of another fabricating method of a linear semiconductor substrate of the present invention.

There will be explained a linear substrate fabricating method of the present invention based on FIG. 13, as a ninth embodiment. The fabricating method of the present invention shown in FIG. 13 is related to one for the linear semiconductor substrate explained with respect to FIG. 2 and formed with the additional thin film 7 such as an oxide film. The linear substrate fabricating method of this embodiment is substantially the same as the fabricating method of the eighth embodiment explained with respect to FIG. 11. However, in FIG. 13, there are supplied a silicon raw material such as $SiCl_4$ from a supply port 131, and oxygen $O_2$ from a supply port 132, so as to form the additional thin film 7 on the polycrystalline silicon 4 as the first thin film. In this way, there is formed a thermally-oxidized film on the polycrystalline silicon 4 as the first thin film, during passage through the heater 105.

As an example of the linear semiconductor substrate produced by the fabricating method of the present invention shown in FIG. 13, the quartz glass preform 101 in a rectangular cross section of 40 cm×40 cm was melted and spun by the first heater 102, thereby producing a rectangular fiber (R's at corners are each 10 μm) of 80 μm×80 μm. The drawn fiber was deposited, on its surface, with an Si film having a thickness of 55 nm at the second heater portion 103, and there was deposited an $SiO_2$ film having a thickness of 50 nm at the fourth heater portion 105 while annealing crystal grains to thereby grow them at the third heater portion 104. Further, coated onto the fiber at the resist coating portion 110 was a resist film which was thermally hardened at the thermal hardening portion 111, and thereafter the fiber was withdrawn by the capstan 112 and wound up by the winder 113. The polycrystalline silicon thin film of the obtained linear semiconductor substrate had a crystal grain diameter of 55 μm and an electron mobility of 105 $cm^2/Vs$. Note that it is possible to deposit an $Si_3N_4$ film at the fourth heater 105, instead of deposition of an $SiO_2$ film.

In case of forming a thermally-oxidized film at a smaller thickness, it is possible to form such a thermally-oxidized film, by supplying oxygen or steam to thereby react it with the polycrystalline silicon 4 formed on the quartz glass backing 3.

Also in case of forming a semiconductor thin film by a method other than the thermal CVD, there is provided a heating furnace for forming an oxide film in case of formation of the oxide film on the semiconductor film.

It is further possible to form a film of silicon nitride ($Si_3N_4$), instead of the thermally-oxidized film, or on the thermally-oxidized film. In case of formation of a silicon nitride film, there are supplied a raw material gas and a nitrogen or ammonia gas into the same furnace as the fiber-drawing furnace during fiber-drawing or into another furnace to thereby form an oxide film of several nanometers to several hundreds nanometers, similarly to the case of forming the thermally-oxidized film.

Tenth Embodiment

There will be explained a linear semiconductor substrate fabricating method for forming two layers of thin films comprising a P type polycrystalline silicon and an N type polycrystalline silicon to be matured into a solar cell, based on a tenth embodiment shown in FIG. 14. This embodiment is substantially the same in constitution as the ninth embodiment shown in FIG. 13, and is different therefrom in that this embodiment supplies, from a supply port 133, a boron (B) or aluminum (Al) raw material or the like serving as a P type dopant in addition to a silicon raw material ($SiCl_4$, $SiCl_3H$, or the like) so as to firstly form a P type polycrystalline silicon. This embodiment is further different in that it supplies, from the supply port 131, a phosphorus (P) or bismuth (Bi) raw material or the like serving as an N type dopant in addition to the silicon raw material so as to form an N type polycrystalline silicon. Note that the deposited semiconductor has a carrier concentration which can be controlled by a concentration of the dopant to be supplied.

Figure 14:
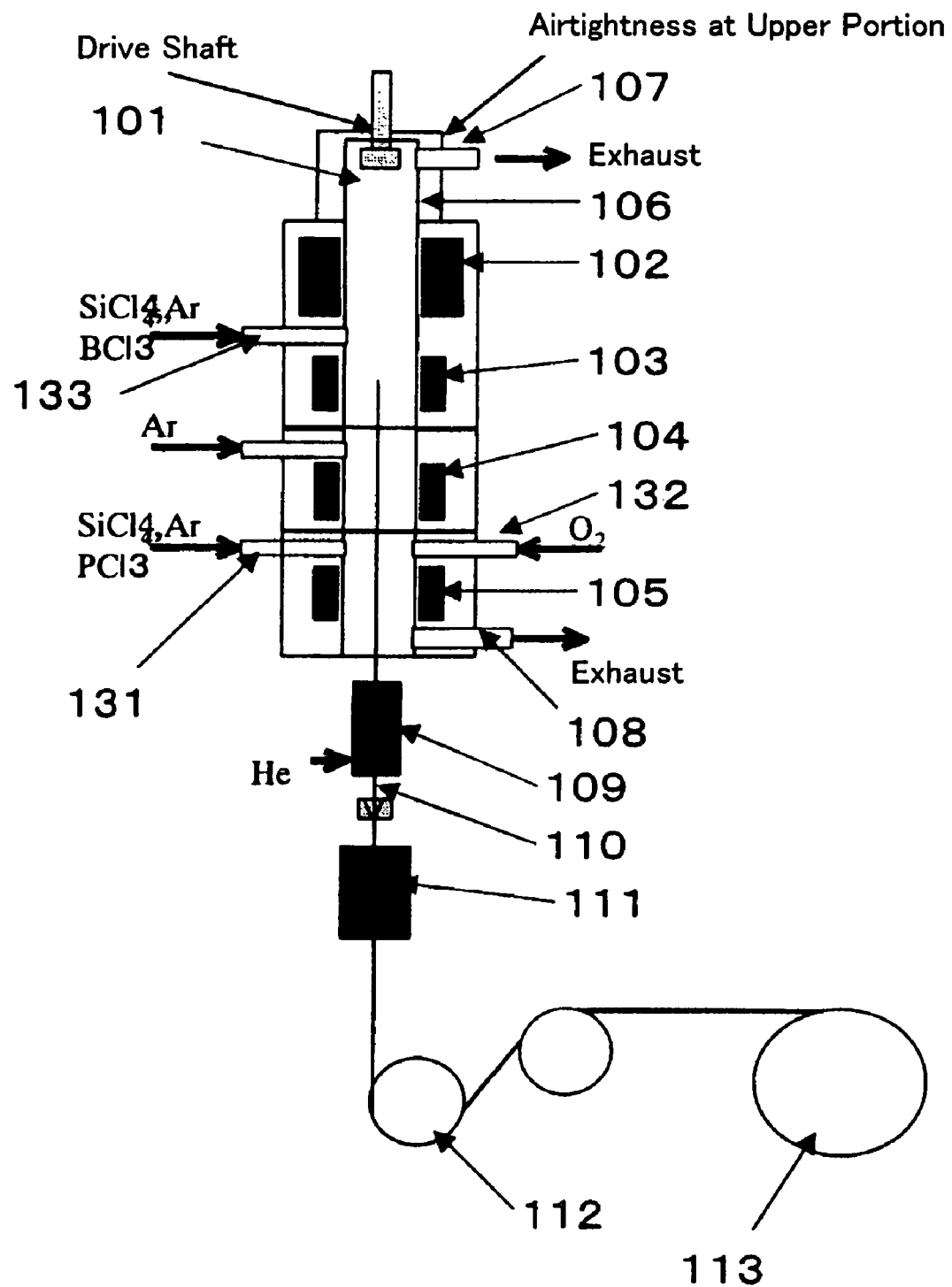
FIG. 14 is an explanatory view of a fabricating method of a linear semiconductor substrate of the present invention, for forming two layers of P type polycrystalline silicon and N type polycrystalline silicon cooperatively constituting a solar cell.

In FIG. 13 and FIG. 14, when the preform 101 is provided in a manner that a porous parent material doped with germanium (Ge) is treated in a reducing atmosphere such as carbon, Si, CO (carbon monoxide), SiC or the like to thereby form amorphous silicon or polycrystalline silicon on the surface of the parent material, or when the preform 101 is provided by depositing silicon on a quartz parent material, deposition of additional silicon onto the matured fiber formed with the original silicon at its surface improves adherence of the additional silicon with the quartz glass. This allowed a silicon film to be easily formed at a film thickness of 5 μm. Further, production was enabled at a fiber-drawing speed of 30 m/s or more. Conducting growth of deposited semiconductor grains enabled realization of a linear substrate for a solar cell having a higher conversion efficiency.

According to the fiber-drawing methods shown in FIG. 13 and FIG. 14, it is possible to form a part or whole of an internal electrode and of semiconductor layers to be matured into a solar cell, between the applicable furnace and the associated capstan 112. It is also possible to provide a step for forming an intermediate layer between the applicable fiber and the associated internal electrode.

Eleventh Embodiment

There will be explained another linear semiconductor substrate fabricating method of the present invention, based on an eleventh embodiment shown in FIG. 15. This fabricating method of the present invention is configured to: fiber-draw a preform 101 through the first heater 102; cool the drawn fiber by the cooling apparatus 109; coat, onto the fiber, a semiconductor particle containing liquid at a coating apparatus 141; and dry, melt, solidify, or solid-phase sinter it at a melting/solidifying portion 142; thereby forming a semiconductor thin film. In this fabricating method of the present invention, no raw material gas for a semiconductor thin film is supplied into the reaction furnace core pipe 106.

Further, it is also possible to form a semiconductor film, by melting a desired semiconductor and by directly coating it onto a fiber as a linear substrate.

Figure 15:
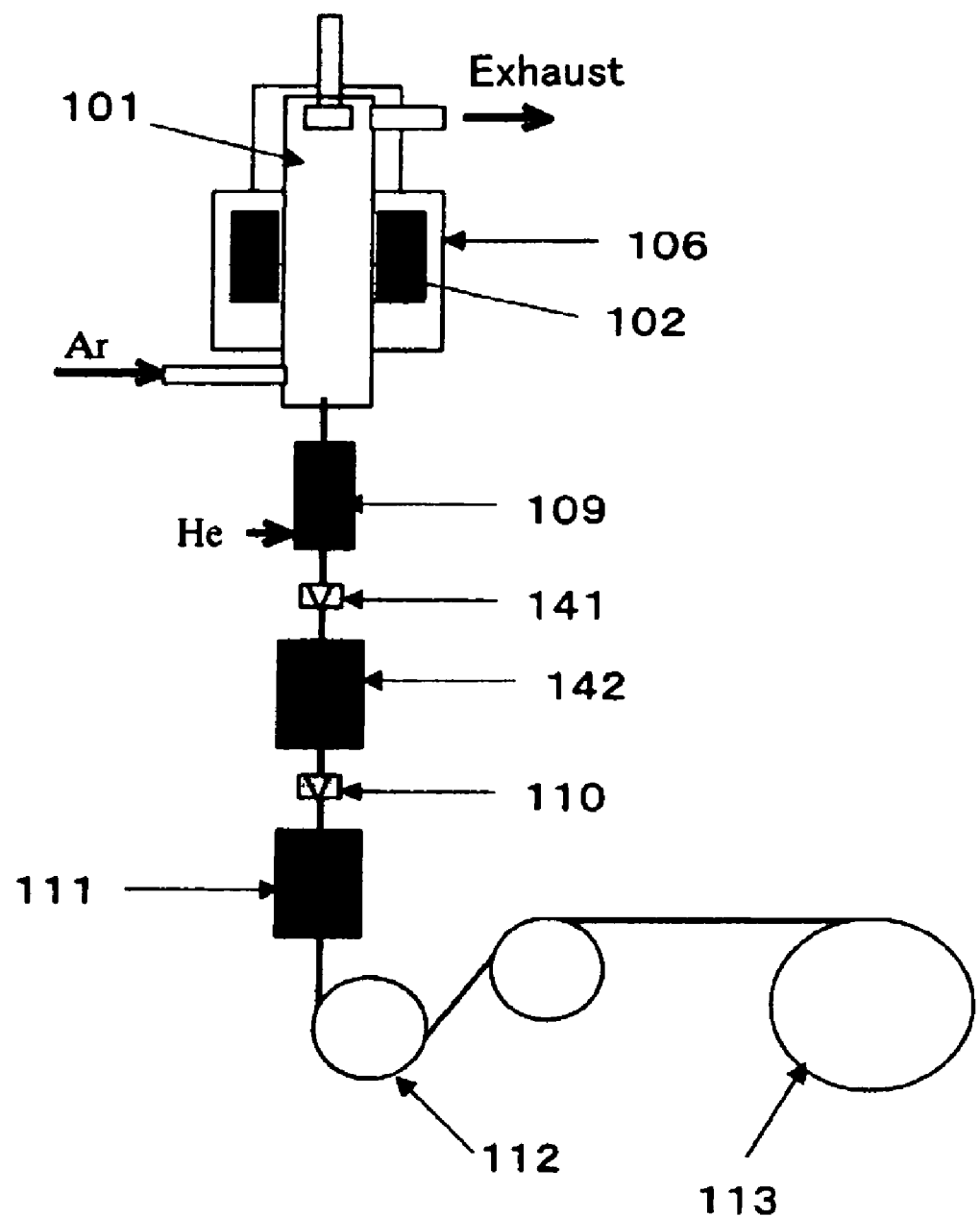
FIG. 15 is an explanatory view of still another fabricating method of a linear semiconductor substrate of the present invention.

As an example utilizing the fabricating method of this embodiment shown in FIG. 15, the quartz glass preform 101 in a rectangular cross section of 40 cm×40 cm was melted by the first heater 102, and spun into a rectangular fiber (R's at corners are each 15 µm) of 150 µm×150 µm. The drawn fiber was cooled by the cooling apparatus 109; the fiber was then coated with a paste-like liquid including silicon particulates suspended therein, by a coating die at the coating apparatus 141; and the coated liquid was heated and fired to 1,500° C. and cooled, at the melting/solidifying portion 142. Further, the fiber was coated with a resist film at the resist coating portion 110 followed by thermal hardening at the thermal hardening portion 111, and then wound up by the winder 113. The linear semiconductor substrate produced by the production method of the present invention included a polycrystalline silicon film having a thickness of 60 nm, a crystal grain diameter of 50 µm and an electron mobility of 100 $cm^2/Vs$.

Concerning a linear substrate comprising a quartz glass backing as a linear substrate having a surface formed with a transparent electroconductive film, the fabricating method of a linear ITO substrate including the transparent electroconductive film formed of ITO is substantially the same as the embodiment explained in FIG. 11 or 13, and is different therefrom in that: the raw material for the thin film is different; and there is unrequired a process for growing a crystal such as in case of a semiconductor, thereby requiring only two heating zones at a location for heating and melting a preform, and another location for reacting a raw material of thin film with the preform.

Further, in case of the fabricating method shown in FIG. 15 adapted to deposit ITO by sintering it after coating it onto a fiber: no raw material gas is to be flowed into the reaction furnace core pipe 106; the melted and spun fiber is cooled by the cooling apparatus 109 and then coated with a liquid raw material by the coating apparatus 141; it is heated and fired at the melting/solidifying portion 142; it is coated with a protective film; and it is then wound up by the winder 113. For improved adherence with the backing, it is desirable to coat the raw material after coating a base resin.

There will be explained a fabricating method of a two-dimensional or curve surfaced module adopting the linear substrate of the present invention, based on FIG. 16. The module fabricating method of the present invention includes operations which can be roughly classified into four processes. The first one comprises a linear substrate fabricating process 151 for producing a linear substrate of the present invention, the second one comprises a segmenting process 152 for integrating linear substrates with each other into segments or arrays, the third one comprises a device fabrication process 153 for forming devices, and the fourth one is a modularizing process 154 for arranging them into a two-dimensional flat plane or curved plane.

Figure 16:
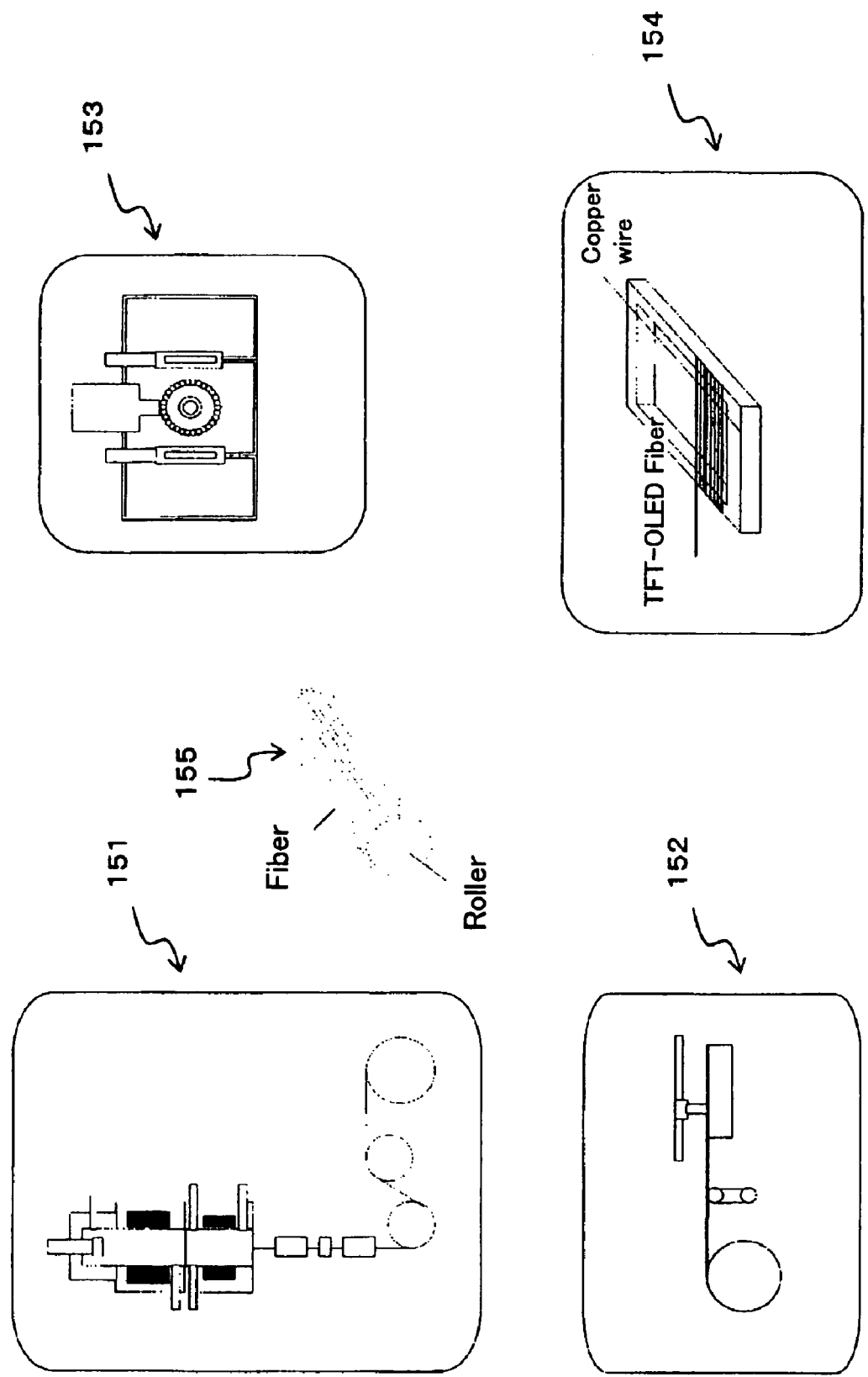
FIG. 16 is an explanatory view of a fabricating method of a two-dimensional or curve surfaced module adopting the linear substrate of the present invention.

In FIG. 16, linear substrates are segmented and integrated at the segmenting process 152 into a roller substrate 155 or a flat substrate (not shown) to thereby allow compactization, thereby allowing an apparatus of the device fabrication process 153 to be downsized. This drastically decreases an equipment cost for the device fabrication process 153, and allows a throughput to be enhanced to several tens times, several hundreds times, or even to several thousands times. Further, it is unnecessary to apply an excessive tension to the linear substrate, and the process can be implemented in a non-contact manner.

The fabricating method of the two-dimensional or curve surfaced module utilizing the linear substrate of the present invention as explained based on FIG. 16, can be directly applied to a case where the linear substrate is a linear solar cell.

Figure 17:
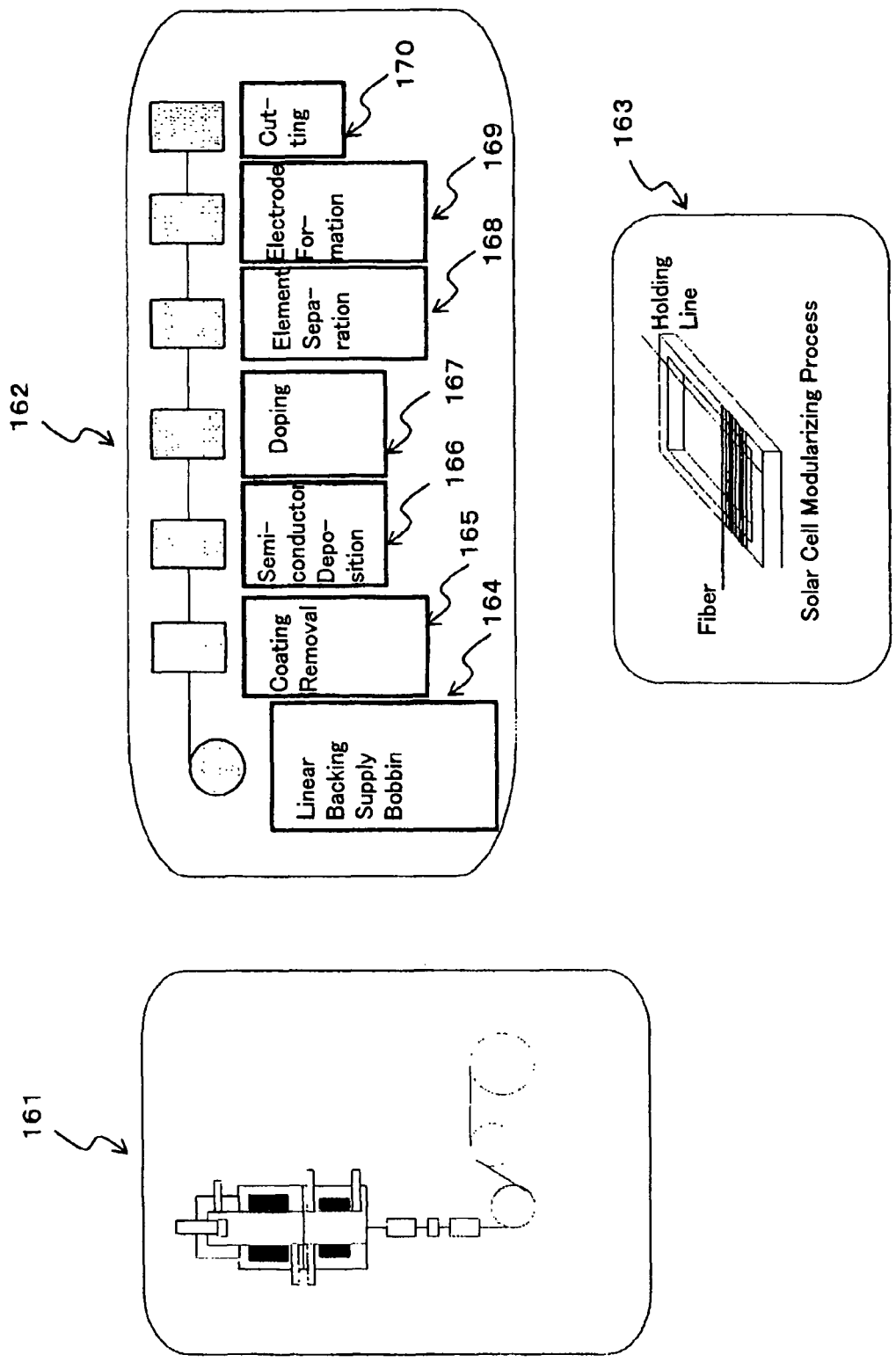
FIG. 17 is an explanatory view of another fabricating method of a two-dimensional or curve surfaced module adopting the linear substrate of the present invention.

There will be explained a two-dimensional or curved plane module fabricating method which is different from the fabricating method explained in FIG. 16, with reference to FIG. 17. In FIG. 17, the fabricating method is shown for a solar cell module, for example. This fabricating method of the present invention can be classified into three processes. The first one comprises a linear substrate/backing fabricating process 161 for producing a linear substrate or linear substrate, the second one comprises a device fabrication process 162 for forming solar cell elements onto the wound up linear material, and the final third one comprises a modularizing process 163 for arranging them into a two-dimensional flat plane or curved plane.

Further, the device fabrication process 162 as the second process comprises a coating (protective film) removal step 165, a semiconductor deposition step 166, a doping step 167, an element separation step 168, an electrode formation step 169, and a cutting step 170. Depending on designs of the fabricating steps, it is possible to supply the linear substrate or linear backing by a bobbin at each process, and to wind up it onto another bobbin at the end of the processes. In this case, it is desirable to wind up the linear substrate onto the bobbin after forming a protective film on the substrate, so as not to damage the processed films thereon. Further, it is desirable to simultaneously process several threads to several tens threads of linear substrates, for an improved productivity.

Moreover, in the device fabrication process 153 in FIG. 16 or the device fabrication process 162 in FIG. 17, although it is possible to treat the substrate(s) in a vacuum process by conducting differential evacuation, it is desirable to adopt an atmospheric process in consideration of productivity and maintenance ability. For example, it is conceivable to adopt processes of: coating removal, semiconductor deposition, etching, electrode formation, and the like by atmospheric plasma; removal of protective film by wet etching; wiring by ink jet, dispenser, or printing technique; etching by laser; and the like.

As an example of the segmenting process 152 shown in FIG. 16, it is conceivable to use a process constituted of: means for drawing out the coated linear semiconductor substrate wound on a bobbin, at a constant tension; means for fixing the linear semiconductor substrate onto an integrated-substrate holder; integrated-substrate holder moving means for moving the integrated-substrate holder to thereby arrange the linear semiconductor substrate at intervals of predetermined spacings; and means for cutting the linear semiconductor substrate.

As another fabricating method of a linear solar cell of the present invention, there is a method which adopts a linear substrate comprising a fiber-shaped glass backing formed with an internal electrode, and/or an N type or P type semiconductor layer to be included in a solar cell, and which method conducts, at least procedures: to deposit a semiconductor having a polarity opposite to that of the linear substrate, or to form a semiconductor having a relatively high resistance and deposit or dope a semiconductor having a polarity opposite to that of the linear substrate, thereby forming elements; to separate the elements from each other; and to form electrodes between the elements, respectively.

It is further possible to implement a process treatment for a solar cell by using a linear substrate formed with a part or whole of electrodes, semiconductor films, and the like constituting solar cell elements, respectively, to thereby fabricate a linear solar cell.

In the linear substrate fabricating methods of the present invention, it is possible to use a high temperature process (such as thermal CVD method, high temperature plasma method, or the like) by utilizing a fiber-drawing technique for an optical fiber. This enables formation of deposited films at a higher speed as compared with a conventional vacuum process, and the steps thereafter can also be conducted at a higher speed, thereby enabling production of linear semiconductor substrates at a lower cost.

By adopting the backing made of quartz glass, it becomes possible to drastically decrease a film thickness of a semiconductor portion as compared with a semiconductor wafer substrate. Although the linear semiconductor substrates of the present invention each adopts expensive quartz glass, the usage amount of quartz glass can be remarkably decreased by virtue of the nature of a linear substrate, while enabling obtainment of quartz glass at a relatively low cost by utilizing a synthesizing technique for an optical fiber. This enables the cost of the backing to be decreased down to the same or lower level as or than that of a conventional multicomponent glass substrate.

Although the linear substrate fabricating method of the present invention is required to include production facilities located in a tall building due to the usage of the fiber-drawing technique for an optical fiber, the producing apparatus itself is remarkably inexpensive as compared with a semiconductor producing apparatus or a grinding/polishing/producing apparatus of a glass substrate for liquid crystal or the like, thereby enabling an equipment investment to be restricted. Further, the drawn fiber has a clean surface, and roughness within a size of a device is as small as several nanometers to several tens nanometers, thereby eliminating necessity of cleaning and polishing before deposition, which also becomes a factor of a decreased fabricating cost.

In any one of the manufacturing methods of the present invention, it is possible to realize deposition at a high speed which is 10 times to 100 times faster than a speed for deposition by a vacuum method, and to produce a linear semiconductor substrate at a high throughput (high speed at 20 m/s or more) and a decreased cost. For example, in case of a substrate of 1 m$^2$, there is weighed about 9 kg for a two-dimensional substrate and there is weighed 700 g for an array of linear substrates, thereby enabling a usage amount of backings to be decreased down to $^1\!/_{10}$ or less. Further, according to the method of the present invention, each semiconductor film to be formed on a linear substrate is never contacted with any solid matter until the semiconductor film is deposited to a required thickness, and then the substrate is coated with a protective film followed by withdrawal by the capstan and thereafter wound up by the winder. Thus, there is no risk to damage the deposited semiconductor film, thereby enabling production thereof at a higher speed.

The fabricating method of the present invention is configured to conduct also the process for growing semiconductor grains in the course of the fiber-drawing process in an on-line manner. This process can be realized by establishing a suitable temperature distribution in a fiber-drawing direction. The method of the present invention is to apply an SOI (Si On Insulator) technique established in case of TFT (thin film transistor) of a two-dimensional substrate to a linear substrate. Further, in case of a conventional two-dimensional substrate, polycrystalline silicon deposited at a low temperature was locally heated by laser at a separate process to thereby melt the polycrystalline silicon in a linear direction, followed by cooling to grow a crystal grain. By adjusting an operation speed of the laser, the cooling speed of the molten silicon is controlled. The linear semiconductor substrates are each sufficiently small in substrate width, and in a depth or radius direction, thereby enabling obtainment of a substantially uniform temperature distribution. Further, controlling the temperature distribution in the longitudinal direction of the fiber by heating means such as a heating furnace, allows for precise temperature control. Moreover, adopted as the backing is a material having a heat resistance higher than a melting point of a material to be deposited to thereby allow for deposition at a temperature higher than the melting point of the material to be deposited, thereby enabling deposition at a higher speed.

The present invention adopts quartz glass as a backing for semiconductor (SOI), thereby achieving a sufficient heat resistance of the backing against a melting point of a material to be deposited. This allows adoption of a high-temperature process (chemical reaction at high-temperature) also for an oxide (such as $TiO_2$ or the like) semiconductor and carbide (such as SiC or the like), thereby enabling obtainment of a film quality better than that obtained by a conventional scheme for adopting a vacuum process. Meanwhile, in case of a compound semiconductor, it is likely that a stoichiometric composition is not obtained due to a difference of vapor pressure, and defects are increased. In this case, it is effective to raise a pressure of an ambience, by a raw material gas mixed with: a gas including a highly volatile component; an inert gas; or the like. This is applicable, although the apparatus may be complicated.

Figure 18:
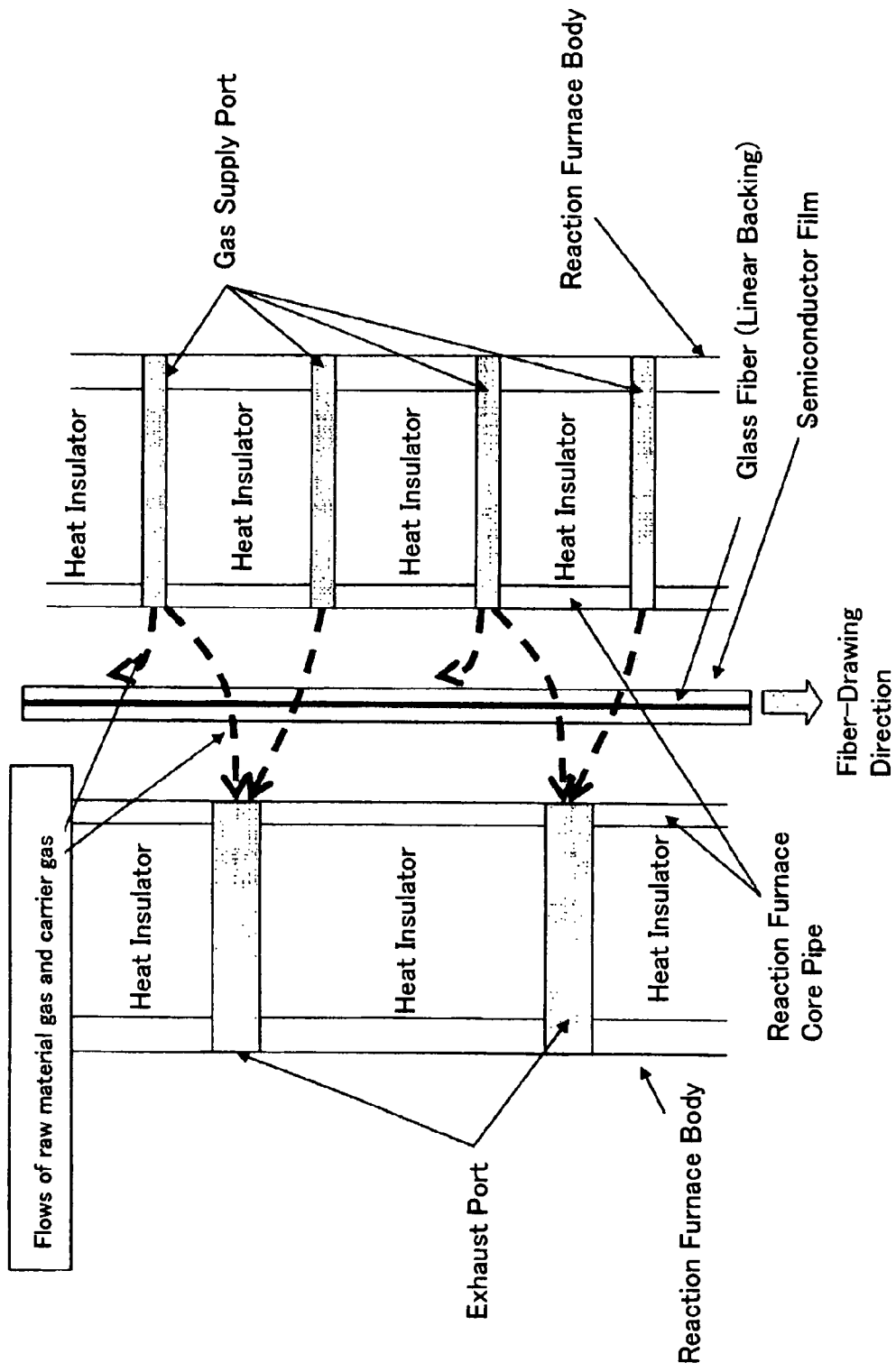
FIG. 18 is an explanatory view of a supply method of a raw material gas into a reaction furnace.
Figure 19:
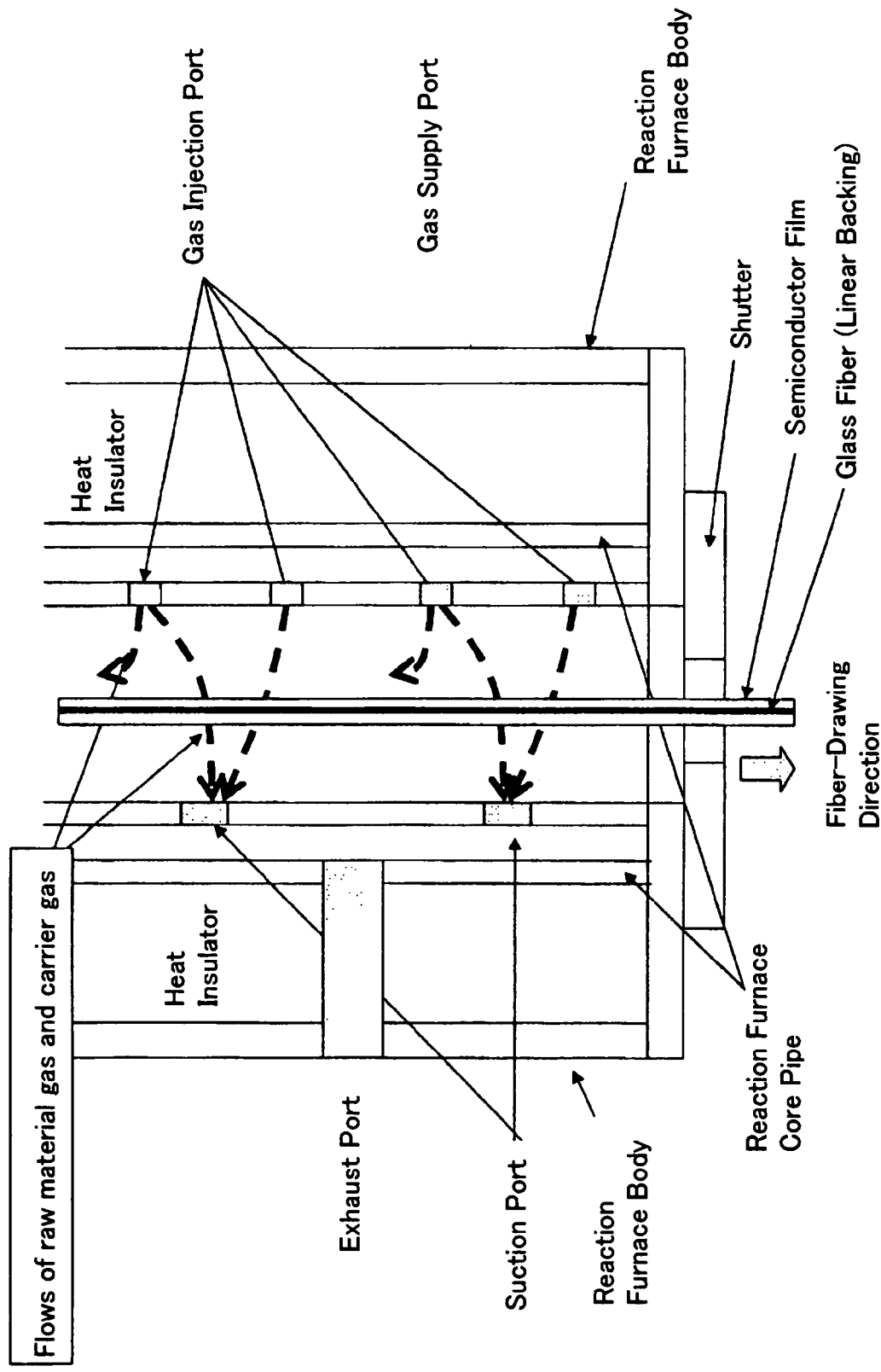
FIG. 19 is an explanatory view of another supply method of a raw material gas into a reaction furnace.
Figure 20:
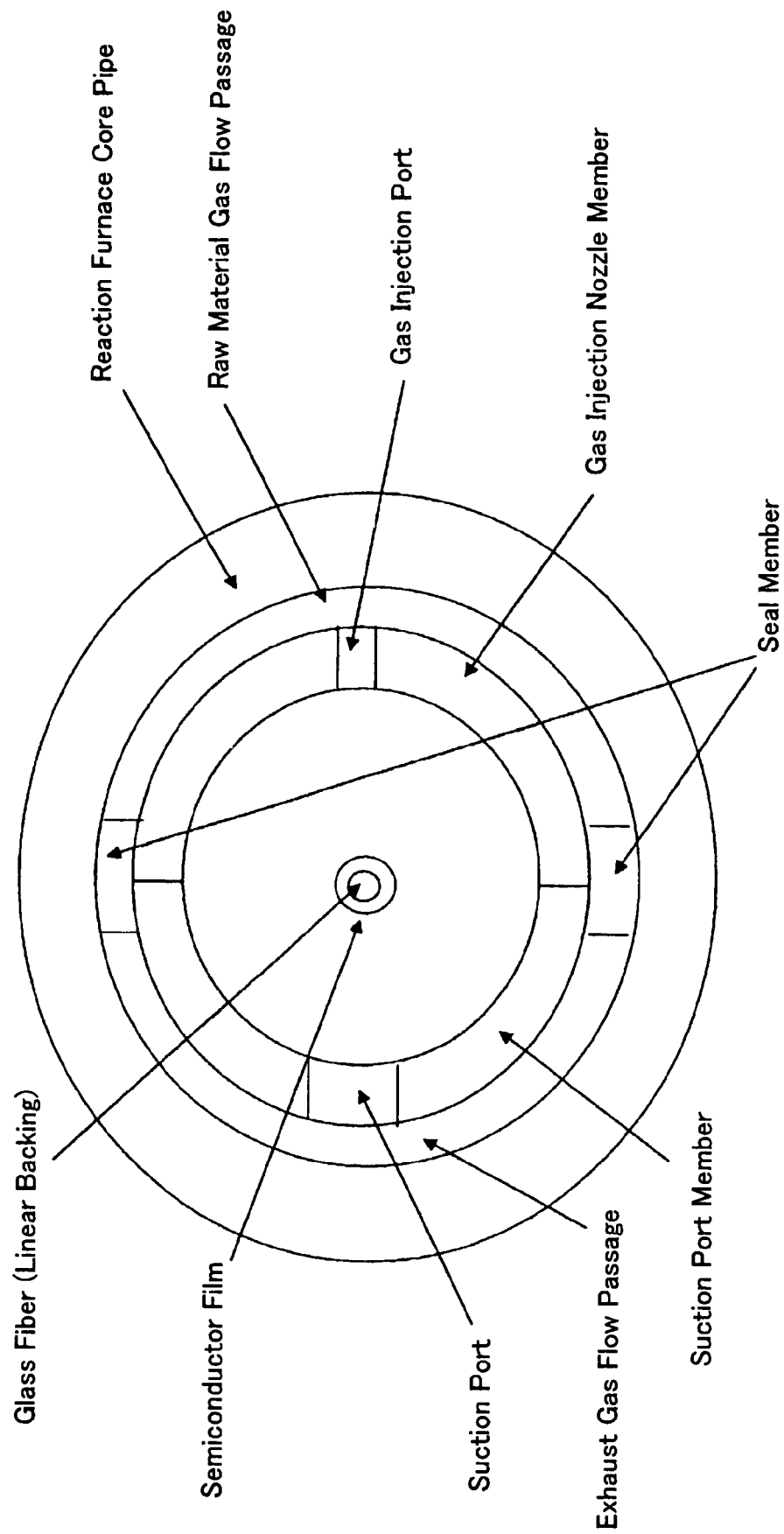
FIG. 20 is an explanatory view of details of a gas injection portion and a gas suction portion of the reaction furnace.

In case of adoption of silicon tetrachloride ($SiCl_4$) in FIG. 11 or FIG. 12, progress of the reaction leads to production of chlorine ($Cl_2$) or hydrogen chloride (HCl) to thereby cause an etching reaction, such that etching finally becomes dominant over deposition. To avoid it, there is supplied a raw material gas in a manner to arrange holes for injecting the raw material gas at certain intervals in a flowing direction thereof (FIGS. 18, 19, and 20), thereby prolonging a zone of depositional condition (i.e., a zone where the raw material concentration can be made sufficiently higher than that of the above-mentioned reaction product, thereby allowing deposition). Further, slightly prolonging the intervals lead to exposure to an etching ambience to thereby enable restriction of growth in an orientation apt to be etched. This enables an intended control to a certain extent. In the present invention, there are provided supply ports and exhaust ports at intervals of 50 mm to 300 mm. The intervals are adjusted depending on a fiber-drawing speed, a temperature of the reaction furnace, or a fiber temperature, so as to attain the fastest deposition rate by the provided supply ports.

INDUSTRIAL APPLICABILITY

At least one layer of intended thin film 4 is formed on a linear substrate 3 having a length ten or more times greater than a width, thickness, or diameter of the backing itself so as to form a linear semiconductor substrate, thereby allowing the linear semiconductor substrate to be readily applied to a device, device array, module, display, solar cell, and solar cell module, utilizing the linear semiconductor substrate.

The invention claimed is:

1. A linear substrate for semiconductor devices, comprising:
   a linear core made of an electrical insulator and having a micro-scaled cross section; and
   a semiconductor film formed on an outer surface of the linear core, wherein
   said semiconductor film has a melting point lower than a melting point of said linear core, and
   said semiconductor film has a grain boundary composition having a grain size of at least ten micrometers.

2. The linear substrate according to claim 1, wherein said linear core is made of an optical fiber.

3. The linear substrate according to claim 2, wherein said optical fiber is made of quartz glass.

4. The linear substrate according to claim 1, wherein said linear core is made of a transparent material.

5. The linear substrate according to claim 1, further comprising:
   an additional semiconductor film formed on said semiconductor film.

6. The linear substrate according to claim 1, wherein the micro-scaled cross section of said linear core is circular shaped.

7. The linear substrate according to claim 1, wherein the micro-scaled cross section of said linear core is polygonal shaped.

8. The linear substrate according to claim 1, wherein said semiconductor film is made of a polycrystalline silicon.

9. The linear substrate according to claim 1, further comprising:
   semiconductor devices formed on said semiconductor film.

10. The linear substrate according to claim 1, further comprising:
    a film formed on said linear substrate, said film including:
      an electroconductive film; and
      a resin film in a form of either a coated liquid resin or a coated and hardened liquid resin.

11. The linear substrate according to claim 10, wherein said electroconductive film is substantially transparent in a visible range, and comprises indium tin oxide (ITO), tin oxide ($SnO_2$) or zinc oxide (ZnO).

12. The linear substrate according to claim 10, wherein said resin film is formed with:
    a resist;
    a UV curable resin;
    silicone;
    oils such as fluorine oil or mineral oil; or
    greases of the oils.

13. The linear substrate according to claim 1, further comprising:
    a metal and/or oxide film formed on said linear substrate.

14. The linear substrate according to claim 1, further comprising:
    a protective film removably formed on said linear substrate.

15. The linear substrate according to claim 1, wherein said semiconductor film is an outermost layer of said linear substrate.

* * * * *

UNITED STATES PATENT AND TRADEMARK OFFICE
CERTIFICATE OF CORRECTION

| | | |
|---|---|---|
| PATENT NO. | : 8,039,927 B2 | Page 1 of 1 |
| APPLICATION NO. | : 11/386871 | |
| DATED | : October 18, 2011 | |
| INVENTOR(S) | : Toshihiro Nakamura et al. | |

It is certified that error appears in the above-identified patent and that said Letters Patent is hereby corrected as shown below:

Column 30, line 30, add claim 16 as follows, --16. The linear substrate according to claim 1, the semiconductor film formed directly on the outer surface of the linear core--.

Signed and Sealed this
Thirty-first Day of July, 2012

David J. Kappos
*Director of the United States Patent and Trademark Office*